United States Patent
Wang et al.

(10) Patent No.: US 12,433,021 B2
(45) Date of Patent: Sep. 30, 2025

(54) ARRAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Qiwei Wang, Beijing (CN); Xiangdan Dong, Beijing (CN); Jun Yan, Beijing (CN); Fan He, Beijing (CN); Kemeng Tong, Beijing (CN); Wenzhe Cai, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/694,013

(22) PCT Filed: May 30, 2023

(86) PCT No.: PCT/CN2023/097082
§ 371 (c)(1),
(2) Date: Mar. 21, 2024

(87) PCT Pub. No.: WO2024/243795
PCT Pub. Date: Dec. 5, 2024

(65) Prior Publication Data
US 2025/0248121 A1    Jul. 31, 2025

(51) Int. Cl.
*H10D 86/40* (2025.01)
*G09G 3/3233* (2016.01)
(Continued)

(52) U.S. Cl.
CPC ......... *H10D 86/441* (2025.01); *G09G 3/3233* (2013.01); *H10D 86/481* (2025.01);
(Continued)

(58) Field of Classification Search
CPC ......... G09G 3/3233; G09G 2300/0426; G09G 2300/0819; G09G 2300/0852;
(Continued)

(56) References Cited

U.S. PATENT DOCUMENTS 11,373,599 B1 * 6/2022 Chen .................... H10K 59/131
2011/0115772 A1   5/2011 Chung
(Continued)

FOREIGN PATENT DOCUMENTS

| CN | 113707704 A | 11/2021 |
| CN | 114530464 A | 5/2022 |

(Continued)

OTHER PUBLICATIONS

International Search Report & Written Opinion mailed Jan. 14, 2024, regarding PCT/CN2023/097082.

*Primary Examiner* — Tom V Sheng
(74) *Attorney, Agent, or Firm* — Intellectual Valley Law, P.C.

(57) ABSTRACT

An array substrate is provided. The array substrate includes a pixel driving circuit having a first reset transistor and a second reset transistor. At least a portion of a gate electrode of a first reset transistor in a present row of pixel driving circuits and at least a portion of a gate electrode of a second reset transistor in a previous row of pixel driving circuits are parts of a unitary structure. The gate electrode of the first reset transistor in the present row of pixel driving circuits and the gate electrode of the second reset transistor in the (Continued)

previous row of pixel driving circuits are arranged along a direction non-parallel to an extension direction of reset control signal lines.

20 Claims, 30 Drawing Sheets

(51) Int. Cl.
*H10D 86/60* (2025.01)
*G09G 3/32* (2016.01)

(52) U.S. Cl.
CPC ............... *H10D 86/60* (2025.01); *G09G 3/32* (2013.01); *G09G 2300/0426* (2013.01); *G09G 2300/0819* (2013.01); *G09G 2300/0842* (2013.01); *G09G 2300/0861* (2013.01); *G09G 2310/08* (2013.01)

(58) Field of Classification Search
CPC ... G09G 2300/0861; G09G 2310/0286; G09G 2310/08; G09G 2320/0233; G09G 2320/0247; G09G 2340/0435; H10K 59/122; H10K 59/40; H10K 59/873; H10K 59/8792
USPC .......................................................... 345/204
See application file for complete search history.

(56) References Cited

U.S. PATENT DOCUMENTS

| | | | | |
|---|---|---|---|---|
| 2019/0303637 | A1* | 10/2019 | Wang | G09G 3/3225 |
| 2021/0097936 | A1* | 4/2021 | Ge | G09G 3/2011 |
| 2021/0375213 | A1* | 12/2021 | Gao | G09G 3/3233 |
| 2022/0278183 | A1* | 9/2022 | Wang | H10K 59/1213 |
| 2023/0069447 | A1 | 3/2023 | Kang et al. | |
| 2024/0169911 | A1* | 5/2024 | Feng | G09G 3/3233 |
| 2024/0177657 | A1* | 5/2024 | Wang | G09G 3/3233 |
| 2024/0206226 | A1* | 6/2024 | Han | H10D 86/60 |
| 2024/0292685 | A1* | 8/2024 | Liu | G09G 3/3233 |
| 2024/0365609 | A1* | 10/2024 | Yang | H10K 59/126 |
| 2024/0381726 | A1* | 11/2024 | Wang | H10K 59/1315 |

FOREIGN PATENT DOCUMENTS

| | | |
|---|---|---|
| CN | 114730542 A | 7/2022 |
| CN | 115020611 A | 9/2022 |
| CN | 115273730 A | 11/2022 |
| CN | 115668348 A | 1/2023 |
| CN | 116137920 A | 5/2023 |
| WO | 2022061546 A1 | 3/2022 |
| WO | 2022078076 A1 | 4/2022 |
| WO | 2023039830 A1 | 3/2023 |

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/097082, filed May 30, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In an aspect, the present disclosure provides an array substrate, comprising a pixel driving circuit having a first reset transistor and a second reset transistor; wherein at least a portion of a gate electrode of a first reset transistor in a present row of pixel driving circuits and at least a portion of a gate electrode of a second reset transistor in a previous row of pixel driving circuits are parts of a unitary structure; and the gate electrode of the first reset transistor in the present row of pixel driving circuits and the gate electrode of the second reset transistor in the previous row of pixel driving circuits are arranged along a direction non-parallel to an extension direction of reset control signal lines.

In some embodiments according to the present disclosure, a channel direction of the first reset transistor is non-parallel to a channel direction of the second reset transistor; and the channel direction of the first reset transistor and the channel direction of the second reset transistor intersect each other, forming a non-zero included angle.

In some embodiments according to the present disclosure, the array substrate further comprises a plurality of first reset signal lines, a plurality of second reset control signal lines, and a plurality of second reset signal lines; wherein the plurality of second reset control signal lines comprises a second reset control signal line in a present stage; in a same row of pixel driving circuit, an orthographic projection of a respective first reset signal line of the plurality of first reset signal lines on a base substrate is between an orthographic projection of the second reset control signal line in the present stage on the base substrate and an orthographic projection of a respective second reset signal line of the plurality of second reset signal lines on the base substrate.

In some embodiments according to the present disclosure, the pixel driving circuit further comprises a data write transistor, a compensating transistor, and a driving transistor; the array substrate comprises a semiconductor material layer, the semiconductor material layer comprises a continuous line comprising an active layer and a second electrode of the compensating transistor, and a second electrode of the first reset transistor; and a branch branching from the continuous line; wherein the branch is connected to a gate electrode of the driving transistor; and an orthographic projection of the branch on a base substrate is non-overlapping with is an orthographic projection of an electrode block comprising a gate electrode of the data write transistor and a gate electrode of the compensating transistor on the base substrate.

In some embodiments according to the present disclosure, the array substrate further comprises a plurality of first reset control signal lines; wherein a respective first reset control signal line of the plurality of first reset control signal lines comprises a main line portion extending along a direction substantially parallel to a first direction, and a protrusion protruding away from the main line portion along a direction substantially parallel to a second direction, the second direction being different from the first direction; the protrusion comprises the at least the portion of the gate electrode of the second reset transistor in the previous row of pixel driving circuits; and the main line portion comprises the at least the portion of the gate electrode of the first reset transistor in the present row of pixel driving circuits.

In some embodiments according to the present disclosure, the array substrate further comprises a plurality of first reset control signal lines and a plurality of second reset control signal lines; wherein the gate electrode of the first reset transistor comprises a first portion from a respective first reset control signal line of the plurality of first reset control signal lines and a second portion from a respective second reset control signal line of the plurality of second reset control signal lines; and an orthographic projection of the first portion on a base substrate at least partially overlaps with an orthographic projection of the second portion on the base substrate.

In some embodiments according to the present disclosure, the array substrate further comprises a voltage supply network; wherein the voltage supply network comprises a plurality of third voltage supply lines and a plurality of fourth voltage supply lines; a respective third voltage supply line of the plurality of third voltage supply lines is connected to one or more fourth voltage supply lines of the plurality of fourth voltage supply lines; and a respective fourth voltage supply line of the plurality of fourth voltage supply lines is connected to one or more third voltage supply lines of the plurality of third voltage supply lines; the plurality of third voltage supply lines are in a first signal line layer; and the plurality of fourth voltage supply lines are in a second signal line layer on a side of the first signal line layer away from a base substrate.

In some embodiments according to the present disclosure, the array substrate further comprises a plurality of light emitting control signal lines and a plurality of second reset signal lines; wherein an orthographic projection of a respective third voltage supply line of the plurality of third voltage supply lines on a base substrate is between an orthographic projection of a respective light emitting control signal line of the plurality of light emitting control signal lines on the base substrate and an orthographic projection of a respective second reset signal line of the plurality of second reset signal lines on the base substrate.

In some embodiments according to the present disclosure, the array substrate further comprises a first reset signal network and a second reset signal network; wherein the first reset signal network comprises a plurality of first reset signal lines and a plurality of third reset signal lines; the second reset signal network comprises a plurality of second reset signal lines and a plurality of fourth reset signal lines; a respective first reset signal line of the plurality of first reset signal lines is connected to one or more third reset signal lines of the plurality of third reset signal lines; a respective third reset signal line of the plurality of third reset signal lines is connected to one or more first reset signal lines of the plurality of first reset signal lines; a respective second reset signal line of the plurality of second reset signal lines is connected to one or more fourth reset signal lines of the plurality of fourth reset signal lines; and a respective fourth reset signal line of the plurality of fourth reset signal lines is connected to one or more second reset signal lines of the plurality of second reset signal lines.

In some embodiments according to the present disclosure, the array substrate further comprises a plurality of data lines, a plurality of second voltage supply lines, a plurality of third reset signal lines, a plurality of fourth reset signal lines, and a plurality of fourth voltage supply lines; wherein a respective fourth voltage supply line of the plurality of fourth voltage supply lines is between two adjacent data lines of the plurality of data lines configured to provide data signals to two adjacent columns of pixel driving circuits, and is between two adjacent second voltage supply lines of the plurality of second voltage supply lines configured to provide first reference voltage signals to two adjacent columns of pixel driving circuits; a respective third reset signal line of the plurality of third reset signal lines is between two adjacent data lines of the plurality of data lines configured to provide data signals to two adjacent columns of pixel driving circuits, and is between two adjacent second voltage supply lines of the plurality of second voltage supply lines configured to provide first reference voltage signals to two adjacent columns of pixel driving circuits; and a respective fourth reset signal line of the plurality of fourth reset signal lines is between two adjacent data lines of the plurality of data lines configured to provide data signals to two adjacent columns of pixel driving circuits, and is between two adjacent second voltage supply lines of the plurality of second voltage supply lines configured to provide first reference voltage signals to two adjacent columns of pixel driving circuits.

In some embodiments according to the present disclosure, the pixel driving circuit further comprises a storage capacitor and a compensating transistor; wherein the storage capacitor comprises a first capacitor electrode and a second capacitor electrode; the second capacitor electrode is configured to be provided with a first reference voltage signal; an orthographic projection of a unitary structure comprising the second capacitor electrode on a base substrate at least partially overlaps with an orthographic projection of a portion of a semiconductor material layer between two channel parts of the compensating transistor on the base substrate.

In some embodiments according to the present disclosure, the unitary structure comprising the second capacitor electrode comprises a main body and an extension extending away from the main body; the extension E includes a first portion, a second portion, and a third portion; the first portion connects the main body with the second portion; the second portion connects the first portion with the third portion; the first portion and the third portion extend along a direction substantially parallel to the second direction, respectively; and the second portion extends along a direction substantially parallel to the first direction.

In some embodiments according to the present disclosure, an orthographic projection of the third portion on the base substrate at least partially overlaps with an orthographic projection of the portion of the semiconductor material layer between the two channel parts of the compensating transistor on the base substrate.

In some embodiments according to the present disclosure, the array substrate further comprises a node connecting line and a plurality of gate lines; wherein the node connecting line is connected to a second electrode of the compensating transistor at a position between a respective gate line of the plurality of gate lines and capacitor electrodes of the storage capacitor; an orthographic projection of the node connecting line on a base substrate is non-overlapping with an orthographic projection of the plurality of gate lines on the base substrate; and an orthographic projection of the second electrode of the compensating transistor on the base substrate partially overlaps with the orthographic projection of the respective gate line on the base substrate.

In some embodiments according to the present disclosure, the array substrate further comprises a node connecting line and a plurality of data lines; wherein the second capacitor electrode spaces apart the node connecting line from the respective data line of the plurality of data lines configured to provide data signal to the pixel driving circuit.

In some embodiments according to the present disclosure, the array substrate further comprises a node connecting line and a plurality of data lines; wherein the extension spaces apart the node connecting line from the respective data line of the plurality of data lines configured to provide data signal to the pixel driving circuit.

In some embodiments according to the present disclosure, the array substrate further comprises a shielding block and a plurality of first reset signal lines; wherein the pixel driving circuit further comprises a compensating transistor; the shielding block is connected to a respective first reset signal line of the plurality of first reset signal lines; and an orthographic projection of the shielding block on a base substrate at least partially overlaps with an orthographic projection of a portion of the semiconductor material layer between two channel parts of the compensating transistor on the base substrate.

In some embodiments according to the present disclosure, the pixel driving circuit further comprises a compensating transistor and a data write transistor; wherein at least a portion of a gate electrode of a compensating transistor in a present column of pixel driving circuits and at least a portion of a gate electrode of a data write transistor in a previous column of pixel driving circuits are parts of a unitary structure.

In some embodiments according to the present disclosure, the array substrate further comprises a plurality of gate lines; wherein the unitary structure comprising the at least the portion of the gate electrode of the compensating transistor in the present column of pixel driving circuits and the at least the portion of the gate electrode of the data write transistor in the previous column of pixel driving circuits is connected to a gate line of the plurality of gate lines.

In some embodiments according to the present disclosure, the array substrate further comprises an interference prevention block and a plurality of second reset signal lines;

wherein the interference prevention block is connected to a respective second reset signal line of the plurality of second reset signal lines; and an orthographic projection of the interference prevention block on a base substrate at least partially overlaps with an orthographic projection of a portion of the semiconductor material layer between two channel parts of the first reset transistor on the base substrate.

In some embodiments according to the present disclosure, the array substrate further comprises an interference prevention block and a plurality of constant voltage signal lines; wherein the interference prevention block is connected to a respective constant voltage signal line of the plurality of constant voltage signal lines; the plurality of constant voltage signal lines are configured to provide a constant voltage signal to the interference prevention block; and an orthographic projection of the interference prevention block on a base substrate at least partially overlaps with an orthographic projection of a portion of the semiconductor material layer between two channel parts of the first reset transistor on the base substrate.

In some embodiments according to the present disclosure, the array substrate further comprises a voltage supply network, a first reset signal network, a second reset signal network, and a pixel definition layer defining a plurality of subpixel apertures; wherein the voltage supply network comprises a plurality of third voltage supply lines and a plurality of fourth voltage supply lines; the first reset signal network comprises a plurality of first reset signal lines and a plurality of third reset signal lines; the second reset signal network comprises a plurality of second reset signal lines and a plurality of fourth reset signal lines; vias connecting signal lines of the voltage supply network, the first reset signal network, and the second reset signal network are substantially outside regions of the plurality of subpixel apertures; and an orthographic projection of the pixel definition layer on a base substrate substantially covers an orthographic projection of a conductive material in the vias connecting signal lines of the voltage supply network, the first reset signal network, and the second reset signal network on the base substrate.

In an aspect, the present disclosure provides a display apparatus, comprising the above array substrate, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a pixel driving circuit having a first reset transistor and a second reset transistor. Optionally, at least a portion of a gate electrode of a first reset transistor in a present row of pixel driving circuits and at least a portion of a gate electrode of a second reset transistor in a previous row of pixel driving circuits are parts of a unitary structure. Optionally, the gate electrode of the first reset transistor in the present row of pixel driving circuits and the gate electrode of the second reset transistor in the previous row of pixel driving circuits are arranged along a direction non-parallel to an extension direction of reset control signal lines.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
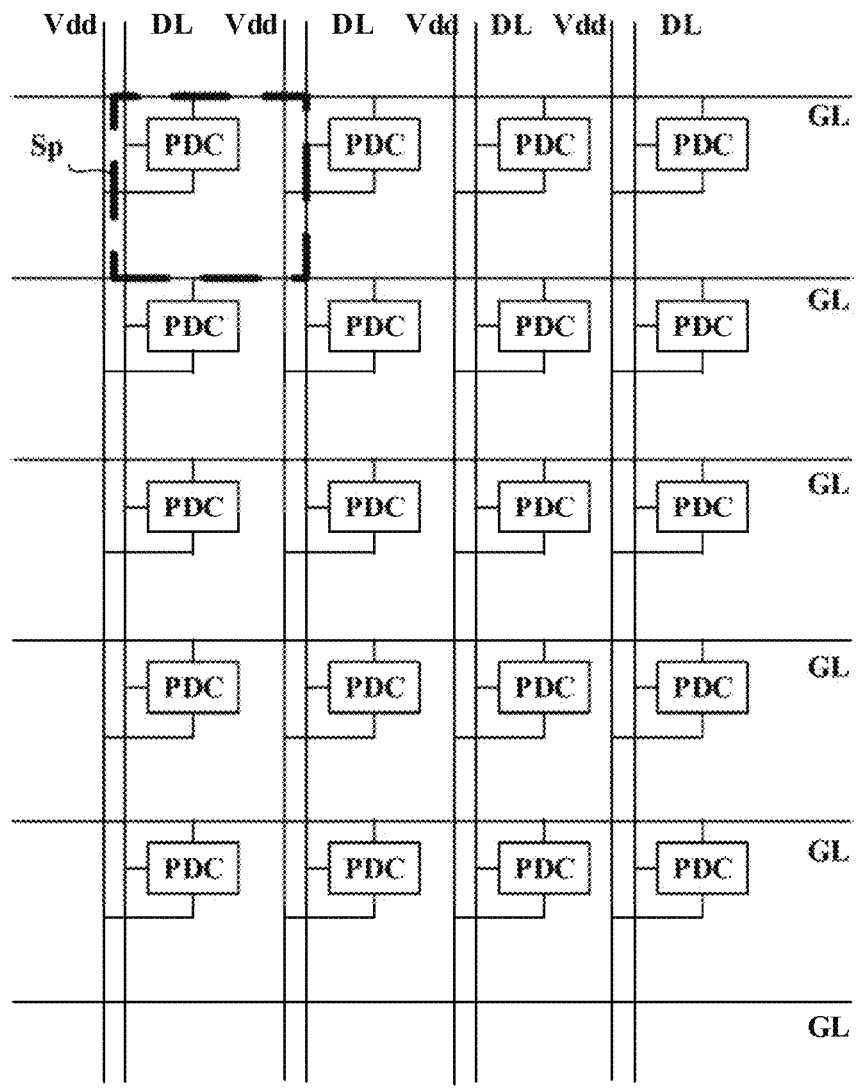
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of first voltage supply line Vdd, and a respective second voltage supply line (e.g., a low voltage supply line). Light emission in a respective subpixel Sp is driven by a respective pixel driving circuit PDC. In one example, a high voltage signal (e.g., a VDD signal) is input, through the respective first voltage supply line of the plurality of first voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage $\Delta V$ that drives light emission in the light emitting element.

Figure 2A:
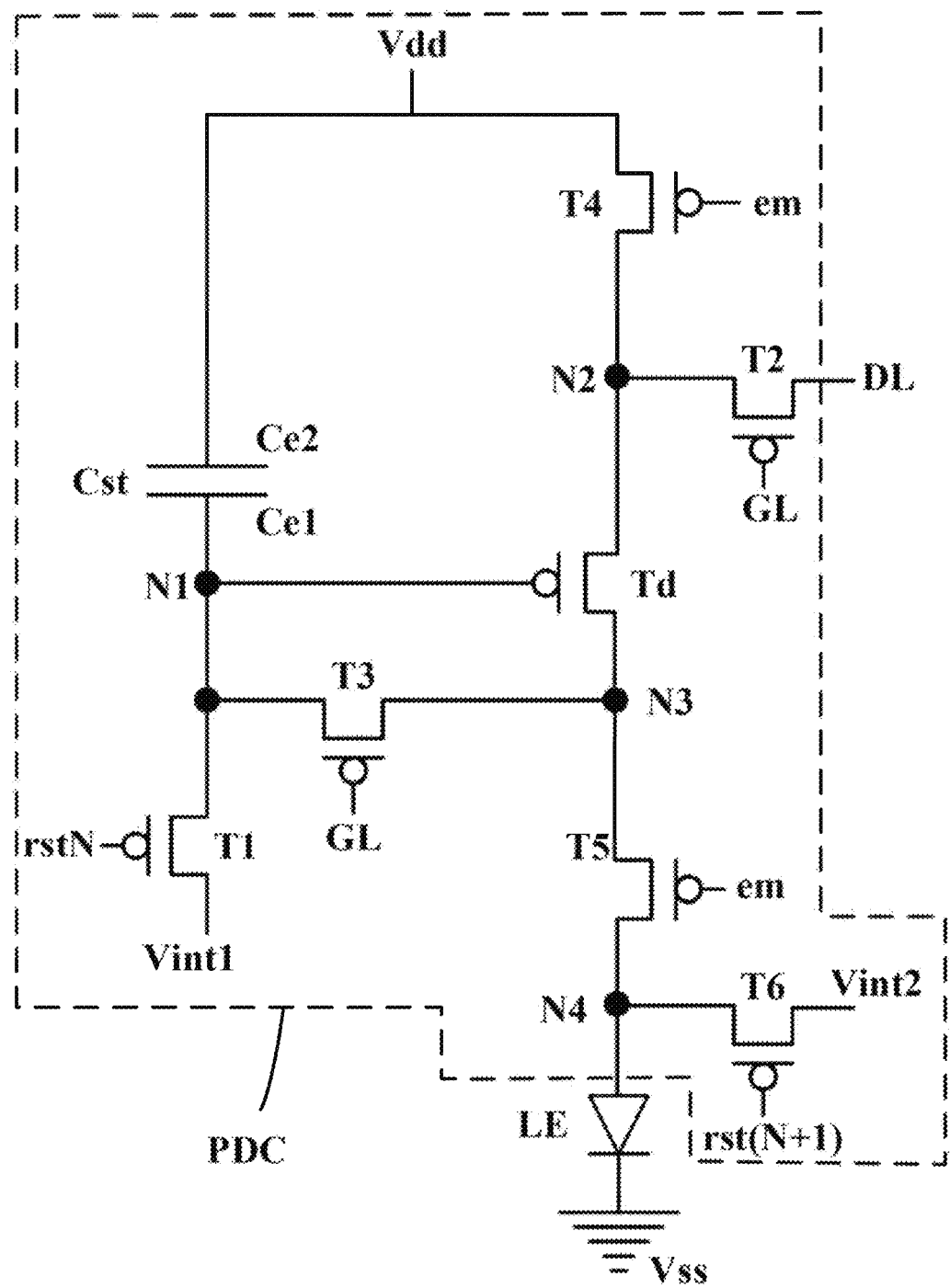
FIG. 2A is a circuit diagram illustrating the structure of a pixel driving circuit in some embodiments according to the present disclosure.

FIG. 2A is a circuit diagram illustrating the structure of a pixel driving circuit in some embodiments according to the present disclosure. Referring to FIG. 2A, in some embodiments, the pixel driving circuit includes a driving transistor Td; a storage capacitor Cst having a first capacitor electrode Ce1 and a second capacitor electrode Ce2; a first transistor T1 having a gate electrode connected to a respective reset control signal line rstN in a present stage, a source electrode connected to a respective first reset signal line of a plurality of first reset signal line Vint1, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of voltage supply lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a reset control signal line rst(N+1) in a next stage, a source electrode connected to a second reset signal line of a plurality of second reset signal lines Vint2, and a drain electrode connected to the drain electrode of the fifth transistor and the anode of the light emitting element LE. The second capacitor electrode Ce2 is connected to the respective voltage supply line and the source electrode of the fourth transistor T4.

In some embodiments, the pixel driving circuit includes a driving transistor Td, a data write transistor (e.g., the second transistor T2), a compensating transistor (e.g., the third transistor T3), two light emitting control transistors (e.g., the fourth transistor T4 and the fifth transistor T5), and two reset transistors (e.g., the first transistor T1 and the sixth transistor T6).

Figure 2B:
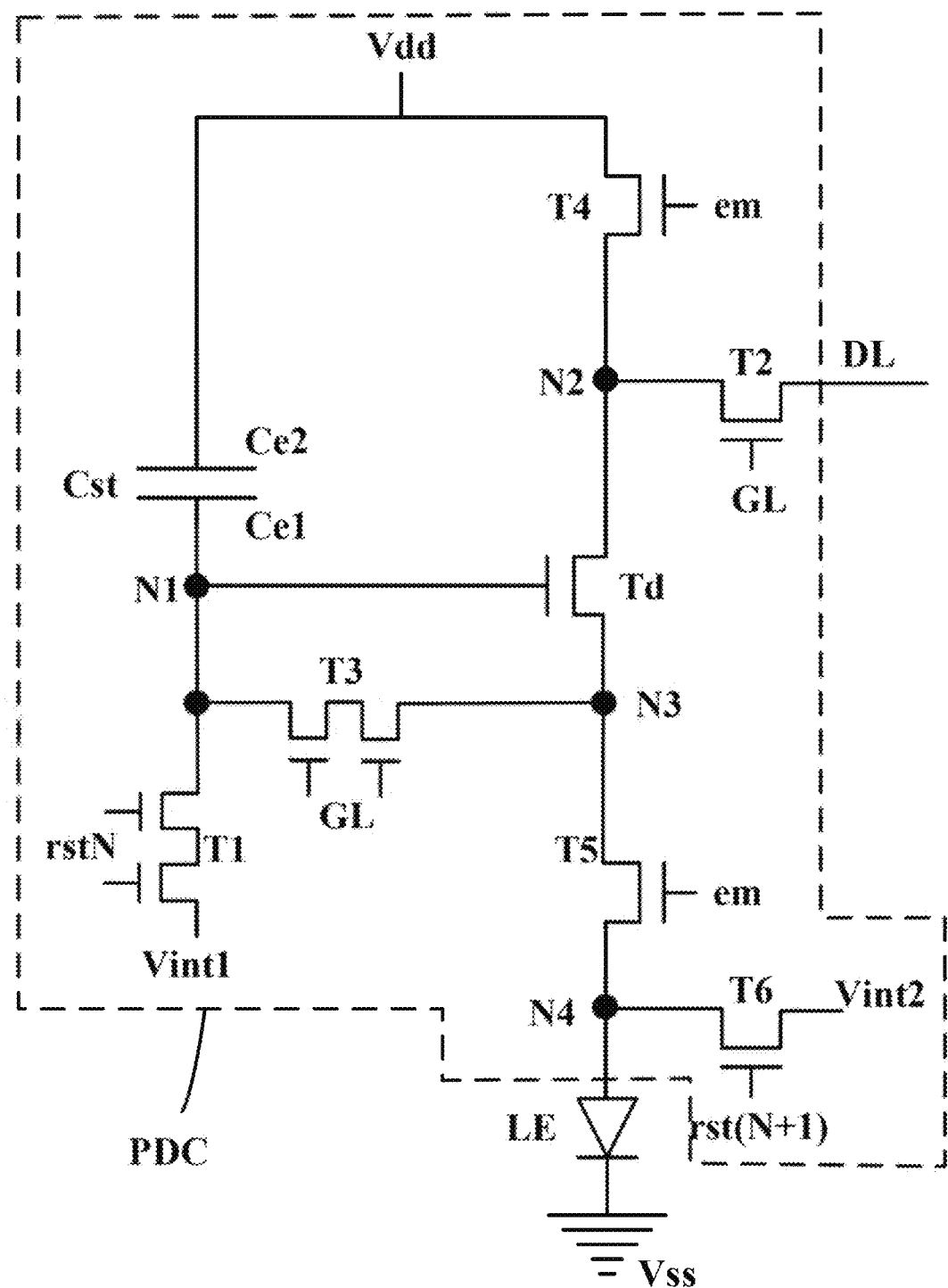
FIG. 2B is a circuit diagram illustrating the structure of a pixel driving circuit in some embodiments according to the present disclosure.

FIG. 2B is a circuit diagram illustrating the structure of a pixel driving circuit in some embodiments according to the present disclosure. Referring to FIG. 2B, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective first gate line of the plurality of first gate lines GL1 twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the first electrode of the third transistor T3. The second node N2 is connected to the second electrode of the fourth transistor T4, the second electrode of the second transistor T2, and the first electrode of the driving transistor Td. The third node N3 is connected to the second electrode of the driving transistor Td, the second electrode of the third transistor T3, and the first electrode of the fifth transistor T5. The fourth node N4 is connected to the second electrode of the fifth transistor T5, the second electrode of the sixth transistor T6, and the anode of the light emitting element LE.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

Figure 2C:
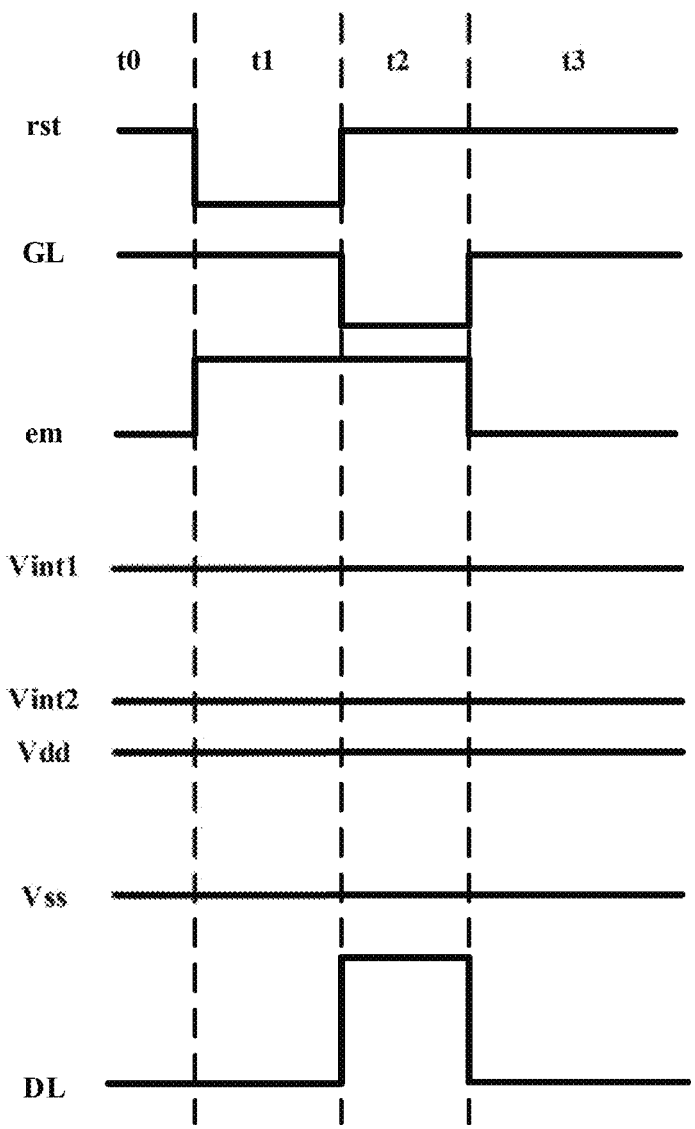
FIG. 2C is a timing diagram illustrating the operation of a pixel driving circuit in some embodiments according to the present disclosure.

FIG. 2C is a timing diagram illustrating the operation of a pixel driving circuit in some embodiments according to the present disclosure. Referring to FIG. 2A to 2C, during one frame of image, the operation of the pixel driving circuit includes a reset sub-phase t1, a data write sub-phase t2, and a light emitting sub-phase t3. In the initial sub-phase t0, a turning-off reset control signal is provided through the respective reset control signal line of the plurality of reset control signal lines rst to the gate electrode of the first transistor T1 to turn off the first transistor T1. In the initial sub-phase t, the respective gate line of the plurality of gate lines GL is provided with a turning-off signal, thus the second transistor T2 and the third transistor T3 are turned off.

In the reset sub-phase t1, a turning-on reset control signal is provided through the respective reset control signal line of the plurality of reset control signal lines rst to the gate electrode of the first transistor T1 to turn on the first transistor T1; allowing an initialization voltage signal from the respective first reset signal line of the plurality of first reset signal lines Vint1 to pass from a first electrode of the first transistor T1 to a second electrode of the first transistor T1, and in turn to the first capacitor electrode Ce1 and the gate electrode of the driving transistor Td. The gate electrode of the driving transistor Td is initialized. The second capacitor electrode Ce2 receives a high voltage signal from the respective first voltage supply line of the plurality of first voltage supply lines Vdd. The first capacitor electrode Ce1 is charged in the reset sub-phase t1 due to an increasing voltage difference between the first capacitor electrode Ce1 and the second capacitor electrode Ce2. In the reset sub-phase t1, the respective gate line of the plurality of gate lines GL is provided with a turning-off signal, thus the second transistor T2 and the third transistor T3 are turned off. The respective light emitting control signal line of the plurality of light emitting control signal lines em is provided with a high voltage signal to turn off the fourth transistor T4 and the fifth transistor T5.

In the data write sub-phase t2, the turning-off reset control signal is again provided through the respective reset control signal line of the plurality of reset control signal lines rst to the gate electrode of the first transistor T1 to turn off the first transistor T1. The respective gate line of the plurality of gate lines GL is provided with a turning-on signal, thus the second transistor T2 and the third transistor T3 are turned on. A second electrode of the driving transistor Td is connected with the second electrode of the third transistor T3. A gate electrode of the driving transistor Td is electrically connected with the first electrode of the third transistor T3. Because the third transistor T3 is turned on in the data write sub-phase t2, the gate electrode and the second electrode of the driving transistor Td are connected and short circuited, and only the PN junction between the gate electrode and a first electrode of the driving transistor Td is effective, thus rendering the driving transistor Td in a diode connecting mode. The second transistor T2 is turned on in the data write sub-phase 2. The data voltage signal transmitted through the respective data line of a plurality of data lines DL is received by a first electrode of the second transistor T2, and in turn transmitted to the first electrode of the driving transistor Td, which is connected to the second electrode of the second transistor T2. A node N2 connecting to the first electrode of the driving transistor Td has a voltage level of the data voltage signal. Because only the PN junction between the gate electrode and a first electrode of the driving transistor Td is effective, the voltage level at the node N1 in the data write sub-phase t2 increase gradually to (Vdata+Vth), wherein the Vdata is the voltage level of the data voltage signal, and the Vth is the voltage level of the threshold voltage Th of the PN junction. The storage capacitor Cst is discharged because the voltage difference between the first capacitor electrode Ce1 and the second capacitor electrode Ce2 is reduced to a relatively small value. The respective light emitting control signal line of the plurality of light emitting control signal lines em is provided with a high voltage signal to turn off the fourth transistor T4 and the fifth transistor T5.

In the data write sub-phase t2, a turning-on reset control signal is provided through the respective reset control signal line of the plurality of reset control signal lines rst in a next adjacent stage to the gate electrode of the sixth transistor T6 to turn on the sixth transistor T6; allowing an initialization voltage signal from the respective second reset signal line of the plurality of second reset signal lines Vint2 to pass from a first electrode of the sixth transistor T6 to a second electrode of the sixth transistor T6; and in turn to the node N4. The anode of the light emitting element LE is initialized.

In the light emitting sub-phase t3, the turning-off reset control signal is again provided through the respective reset control signal line of the plurality of reset control signal lines rst to the gate electrode of the first transistor T1 to turn off the first transistor T1. The respective gate line of the plurality of gate lines GL is provided with a turning-off signal, the second transistor T2 and the third transistor 3 are turned off. The respective light emitting control signal line of the plurality of light emitting control signal lines em is provided with a low voltage signal to turn on the fourth transistor T4 and the fifth transistor T5. The voltage level at the node N1 in the light emitting sub-phase t3 is maintained at (Vdata+Vth), the driving transistor Td is turned on by the voltage level, and working in the saturation area. A path is formed through the fourth transistor T4, the driving transistor Td, the fifth transistor T5, to the light emitting element LE. The driving transistor Td generates a driving current for driving the light emitting element LE to emit light. A voltage level at a node N3 connected to the second electrode of the driving transistor Td equals to a light emitting voltage of the light emitting element LE.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In another example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes a respective first subpixel, a respective second subpixel, and a respective third subpixel. Optionally, each of the respective first subpixel, the respective second subpixel, and the respective third subpixel, includes the first transistor T1, the second transistor T2, the third transistor T3, the fourth transistor T4, the fifth transistor T5, the sixth transistor T6, the driving transistor Td, and the storage capacitor Cst.

In alternative embodiments, a minimum repeating unit of the plurality of subpixels of the array substrate includes a respective first subpixel, a respective second subpixel, a respective third subpixel, and a respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, the driving transistor Td, and the storage capacitor Cst.

Figure 3A:
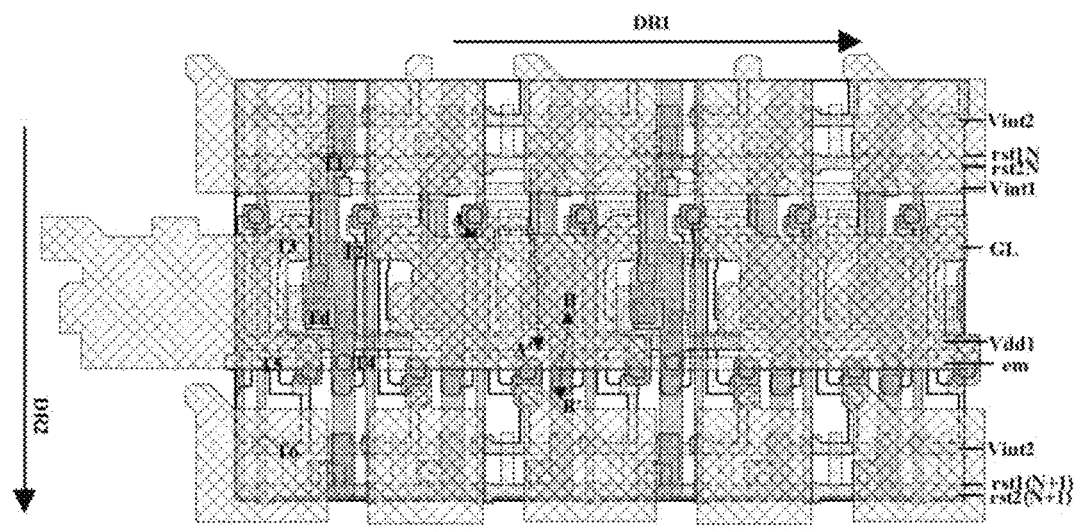
FIG. 3A is a diagram illustrating the structure of an array substrate in some embodiments according to the present disclosure.
Figure 3B:
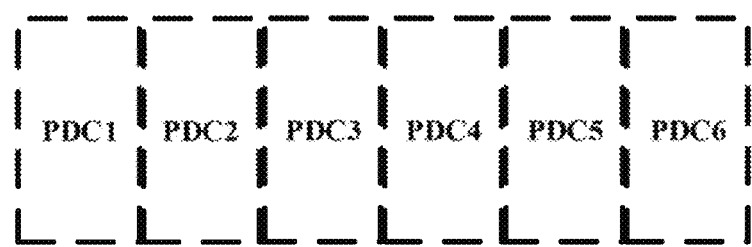
FIG. 3B is a schematic diagram illustrating an arrangement of a plurality of pixel driving circuits in an array substrate depicted in FIG. 3A.

FIG. 3A is a diagram illustrating the structure of an array substrate in some embodiments according to the present disclosure. FIG. 3B is a schematic diagram illustrating an arrangement of a plurality of pixel driving circuits in an array substrate depicted in FIG. 3A. FIG. 3A and FIG. 3B depicts a portion of the array substrate having six pixel driving circuits, including PDC1, PDC2, PDC3, PDC4, PDC5, and PDC6.

Figure 3C:
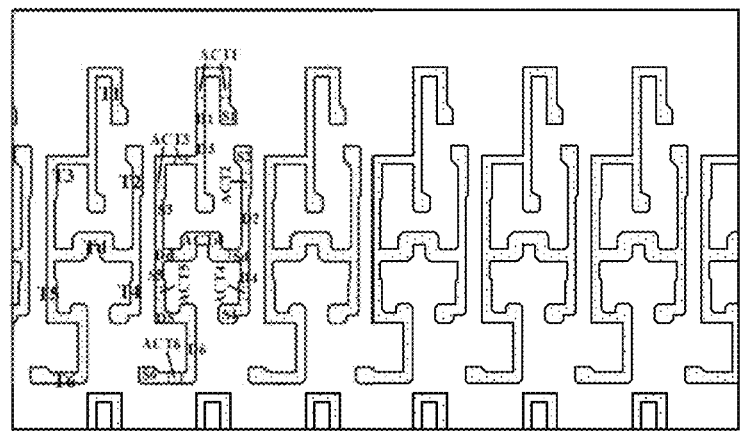
FIG. 3C is a diagram illustrating the structure of a semiconductor material layer in an array substrate depicted in FIG. 3A.
Figure 3D:
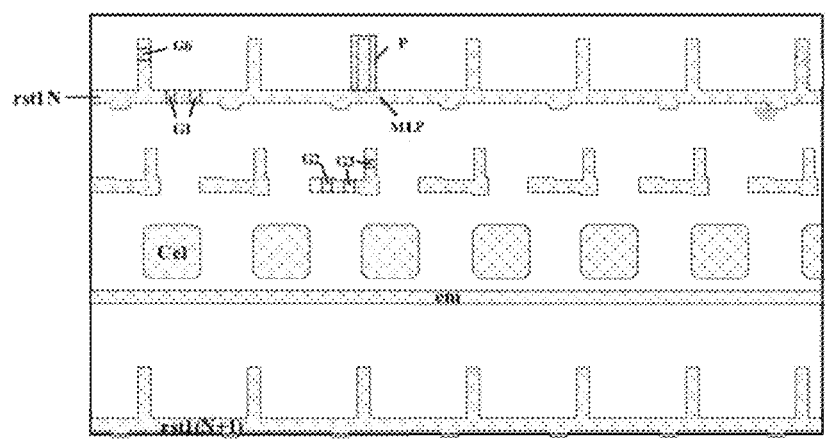
FIG. 3D is a diagram illustrating the structure of a first conductive layer in an array substrate depicted in FIG. 3A.
Figure 3E:
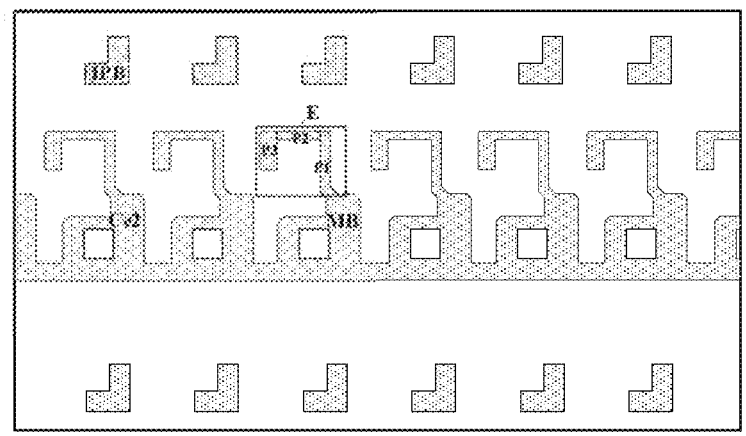
FIG. 3E is a diagram illustrating the structure of a second conductive layer in an array substrate depicted in FIG. 3A.
Figure 3F:
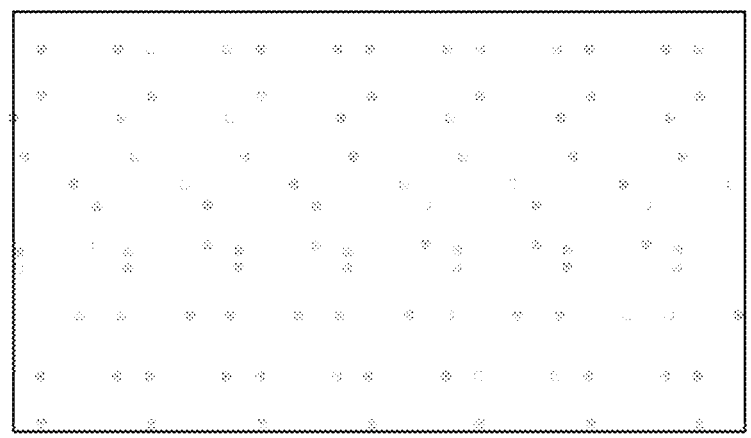
FIG. 3F is a diagram illustrating the structure of an inter-layer dielectric layer in an array substrate depicted in FIG. 3A.
Figure 3G:
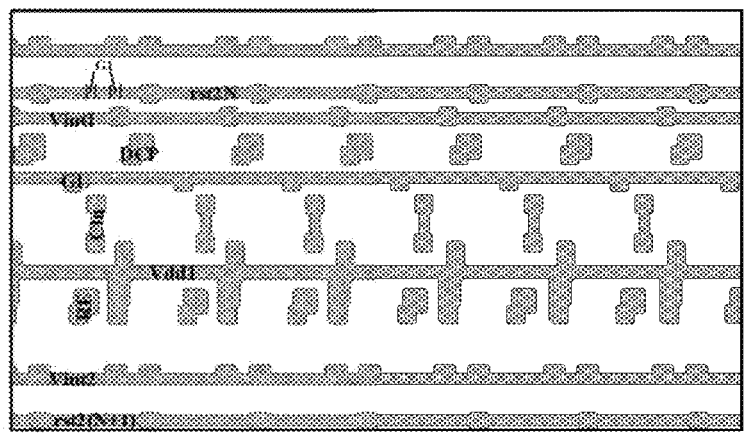
FIG. 3G is a diagram illustrating the structure of a first signal line layer in an array substrate depicted in FIG. 3A.
Figure 3H:
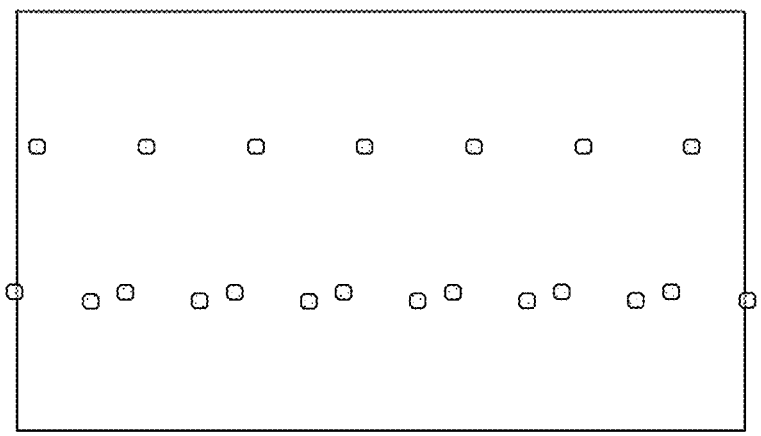
FIG. 3H is a diagram illustrating the structure of a first planarization layer in an array substrate depicted in FIG. 3A.

FIG. 3C is a diagram illustrating the structure of a semiconductor material layer in an array substrate depicted in FIG. 3A. FIG. 3D is a diagram illustrating the structure of a first conductive layer in an array substrate depicted in FIG. 3A. FIG. 3E is a diagram illustrating the structure of a second conductive layer in an array substrate depicted in FIG. 3A. FIG. 3F is a diagram illustrating the structure of an inter-layer dielectric layer in an array substrate depicted in FIG. 3A. FIG. 3G is a diagram illustrating the structure of a first signal line layer in an array substrate depicted in FIG. 3A. FIG. 3H is a diagram illustrating the structure of a first planarization layer in an array substrate depicted in FIG. 3A.

Figure 3I:
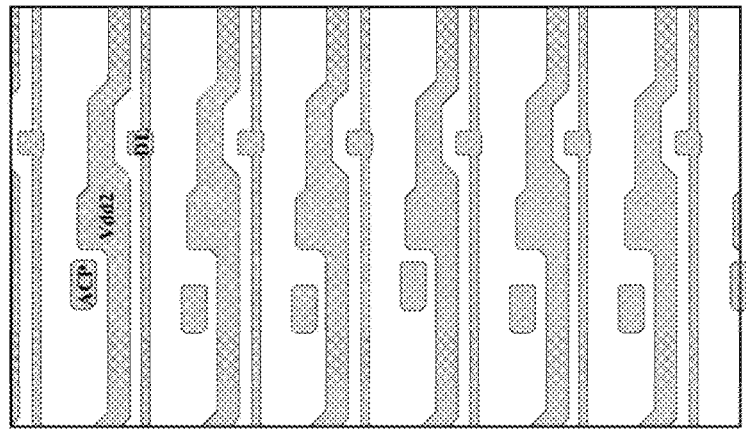
FIG. 3I is a diagram illustrating the structure of a second signal line layer in an array substrate depicted in FIG. 3A.
Figure 3J:
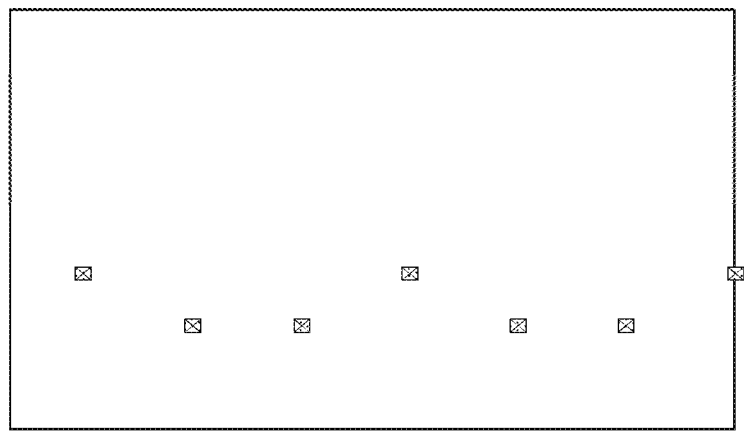
FIG. 3J is a diagram illustrating the structure of a second planarization layer in an array substrate depicted in FIG. 3A.
Figure 3K:
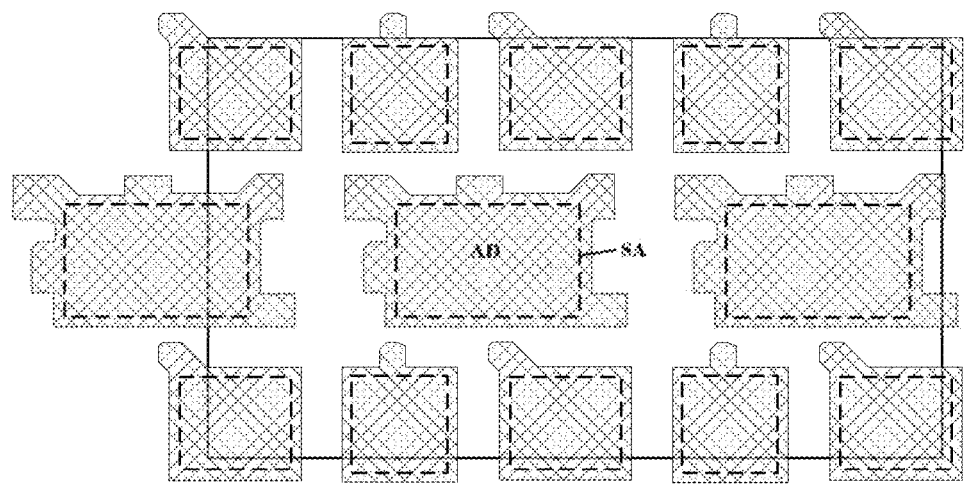
FIG. 3K is a diagram illustrating the structure of an anode layer in an array substrate depicted in FIG. 3A.
Figure 3L:
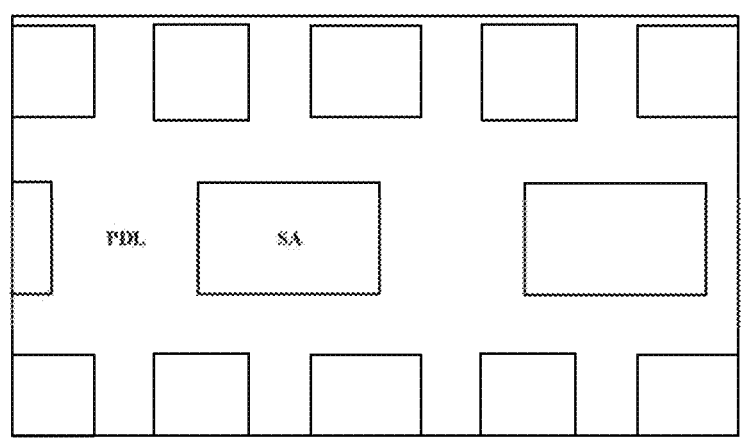
FIG. 3L is a diagram illustrating the structure of a pixel definition layer in an array substrate depicted in FIG. 3A.
Figure 4A:
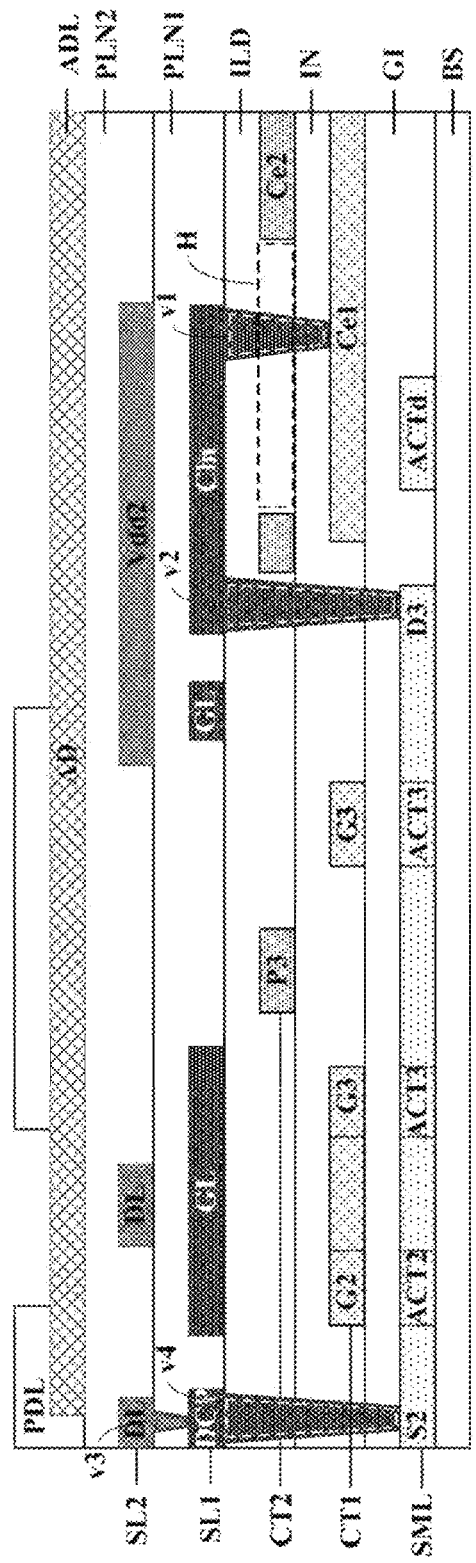
FIG. 4A is a cross-sectional view along an A-A' line in FIG. 3A.
Figure 4B:
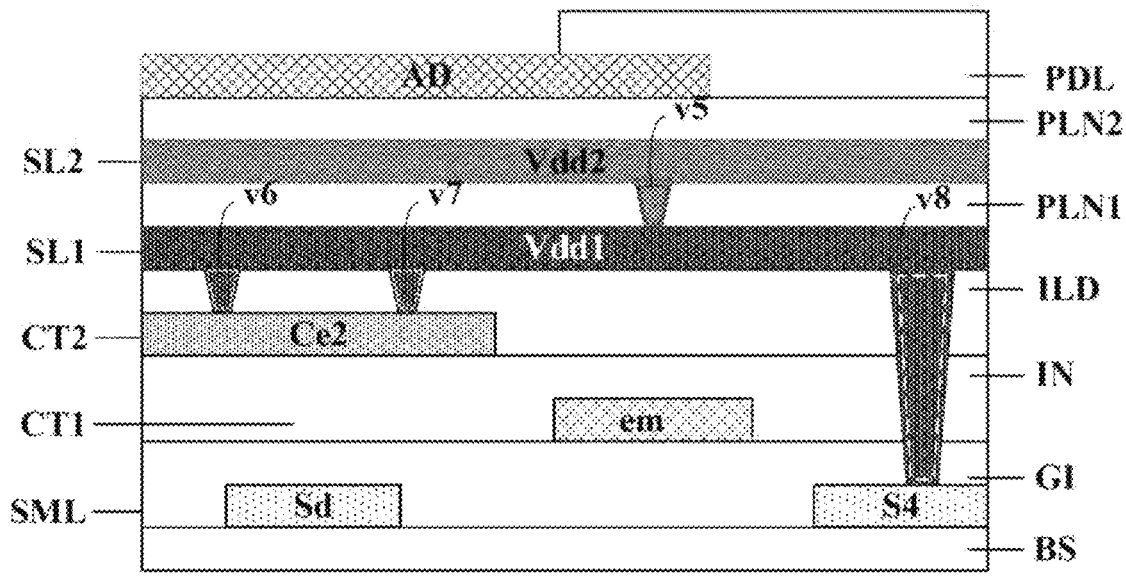
FIG. 4B is a cross-sectional view along a B-B' line in FIG. 3A.

FIG. 3I is a diagram illustrating the structure of a second signal line layer in an array substrate depicted in FIG. 3A. FIG. 3J is a diagram illustrating the structure of a second planarization layer in an array substrate depicted in FIG. 3A. FIG. 3K is a diagram illustrating the structure of an anode layer in an array substrate depicted in FIG. 3A. FIG. 3L is a diagram illustrating the structure of a pixel definition layer in an array substrate depicted in FIG. 3A. FIG. 4A is a cross-sectional view along an A-A' line in FIG. 3A. FIG. 4B is a cross-sectional view along a B-B' line in FIG. 3A.

Referring to FIG. 3A to FIG. 3L, and FIG. 4A to FIG. 4B, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer CT1 away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode layer ADL on a side of the second planarization layer PLN2 away from the second signal line layer SL2, and a pixel definition layer PDL on a side of the anode layer ADL away from the base substrate BS.

Referring to FIG. 2A, FIG. 2B, FIG. 3A, and FIG. 3C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) are in a same layer.

As used herein, the active layer refers to a component of the transistor comprising at least a portion of the semiconductor material layer whose orthographic projection on the base substrate overlaps with an orthographic projection of a gate electrode on the base substrate. A first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

In some embodiments, a channel direction of the first transistor T1 is non-parallel to a channel direction of the sixth transistor T6. The channel direction of the first transistor T1 and the channel direction of the sixth transistor T6 intersect each other, forming a non-zero included angle. As used herein, the term "channel direction" refers to a direction from a first electrode to a second electrode of a transistor. In one example, the channel direction of the first transistor T1 is substantially parallel to the second direction DR2, and the channel direction of the sixth transistor T6 is substantially parallel to the first direction DR1.

Referring to FIG. 2A, FIG. 2B, FIG. 3A, and FIG. 3D, the first conductive layer in some embodiments includes a plurality of first reset control signal lines rst1 (including a first reset signal line in a present stage rst1N and a first reset signal line in a next stage rst1(N+1)), a plurality of light emitting control signal lines em, an electrode block comprising one or more gate electrodes G3 of the third transistor T3 and a gate electrode G2 of the second transistor T2, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first reset control signal lines rst1, the plurality of light emitting control signal lines em, the electrode block comprising one or more gate electrodes G3 of the third transistor T3 and a gate electrode G2 of the second transistor T2, and the first capacitor electrode Ce1 of the storage capacitor Cst are in a same layer.

As used herein, the term "same layer" refers to the relationship between the layers simultaneously formed in the same step. In one example, the plurality of light emitting control signal lines em and the first capacitor electrode Ce1 are in a same layer when they are formed as a result of one or more steps of a same patterning process performed in a same layer of material. In another example, the plurality of light emitting control signal lines em and the first capacitor electrode Ce1 can be formed in a same layer by simultaneously performing the step of forming the plurality of light emitting control signal lines em, and the step of forming the first capacitor electrode Ce1. The term "same layer" does not always mean that the thickness of the layer or the height of the layer in a cross-sectional view is the same.

Referring to FIG. 2A, FIG. 2B, FIG. 3A, and FIG. 3E, the second conductive layer in some embodiments includes an interference prevention block IPB and a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the interference prevention block IPB and the second capacitor electrode Ce2 of the storage capacitor Cst are in a same layer.

Vias extending through the inter-layer dielectric layer ILD are depicted in FIG. 3F.

Referring to FIG. 2A, FIG. 2B, FIG. 3A, and FIG. 3G, the first signal line layer in some embodiments includes a node connecting line Cln, a plurality of second reset control signal lines rst2 (including a second reset control signal line in a present stage rst2N and a second reset control signal line in a next stage rst2(N+1)), a plurality of first reset signal lines Vint1, a plurality of second reset signal lines Vint2, a plurality of gate lines GL, a plurality of first voltage supply lines Vdd1, a relay electrode RE, and a data signal connecting pad DCP. The node connecting line Cln connects the first capacitor electrode Ce1 and the first electrode of the driving transistor Td in a respective pixel driving circuit together. The data signal connecting pad DCP is configured to connect a respective data line of the plurality of data lines to a first electrode of the second transistor T2. The relay electrode RE connects the fourth node N4 and an anode contact pad together. The relay electrode is connected to second electrodes of the fifth transistor T5 and the sixth transistor T6. The anode contact pad is in the second signal line layer, and is connected to an anode in a respective subpixel. The plurality of first voltage supply lines Vdd1 are interconnected with a plurality of second voltage supply lines, forming an interconnected reset signal network. A respective first voltage supply line of the plurality of first voltage supply lines Vdd1 is connected to a first electrode of the fourth transistor T4, and connected to the second capacitor electrode Ce2 of the storage capacitor Cst. Optionally, the plurality of first voltage supply lines Vdd1 extend along a direction substantially parallel to a first direction DR1; the plurality of second voltage supply lines extend along a direction substantially parallel to a second direction DR2. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees.

Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the node connecting line Clnn, the plurality of second reset control signal lines rst2 (including the second reset control signal line in a present stage rst2N and the second reset control signal line in a next stage rst2(N+1)), the plurality of first reset signal lines Vint1, the plurality of second reset signal lines Vint2, the plurality of gate lines GL, the plurality of first voltage supply lines Vdd1, the relay electrode RE, and the data signal connecting pad DCP are in a same layer.

In some embodiments, in a same row of pixel driving circuit, an orthographic projection of a respective first reset signal line of the plurality of first reset signal lines Vint1 on a base substrate is between an orthographic projection of a second reset control signal line in a present stage rst2N of the plurality of second reset control signal lines rst2 on the base substrate and an orthographic projection of a respective second reset signal line of the plurality of second reset signal lines Vint2 on the base substrate.

Vias extending through the first planarization layer PLN1 are depicted in FIG. 3H.

Referring to FIG. 2A, FIG. 2B, FIG. 3A, and FIG. 3I, the second signal line layer in some embodiments includes a plurality of second voltage supply lines Vdd2, a plurality of data line DL, and an anode contact pad ACP. The anode contact pad ACP is electrically connected to second electrodes of the fifth transistor T5 and the sixth transistor T6 in the respective pixel driving circuit through a relay electrode. The anode contact pad ACP is electrically connected to an anode in a respective subpixel. The plurality of second voltage supply lines Vdd2 are interconnected with a plurality of first voltage supply lines, forming an interconnected reset signal network. A respective data line of the plurality of data lines is electrically connected to a first electrode of the second transistor T2 through a data signal connecting pad.

Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second voltage supply lines Vdd2, the plurality of data line DL, and the anode contact pad ACP are in a same layer.

Vias extending through the second planarization layer PLN2 are depicted in FIG. 3J.

Referring to FIG. 2A, FIG. 2B, FIG. 3A, and FIG. 3K, the array substrate further includes an anode layer ADL. A plurality of subpixel apertures SA respectively corresponding to a plurality of anodes are denoted in FIG. 3K. Vias extending through the second planarization layer PLN2 are depicted in FIG. 3M. A respective anode is connected to a respective anode contact pad through a respective via extending through the second planarization layer PLN2.

Referring to FIG. 2A, FIG. 2B, FIG. 3A, and FIG. 3L, the array substrate further includes a pixel definition layer PDL, defining a plurality of subpixel apertures SA.

Referring to FIG. 2A, FIG. 2B, FIG. 3A, FIG. 3D, FIG. 3E, FIG. 3G, and FIG. 4A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as at least one of the plurality of second reset control signal lines rst2, the plurality of first reset signal lines Vint1, the plurality of second reset signal lines Vint2, the plurality of gate lines GL, the plurality of first voltage supply lines Vdd1, the relay electrode RE, or the data signal connecting pad DCP.

In some embodiments, the first capacitor electrode Ce1 is on aside of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer GI. Optionally, the node connecting line Clnn is connected to the first capacitor electrode Ce1 through the first via v1, and the node connecting line Cln is connected the semiconductor material layer SML through the second via v2. Optionally, the node connecting line Cln is connected to the second electrode D3 of third transistor, as depicted in FIG. 4A.

In some embodiments, the array substrate further includes a third via v3 and a fourth via v4. The third via v3 extends through the first planarization layer PLN1. The fourth via v4 extends through the inter-layer dielectric layer ILD, the insulating layer IN, and the gate insulating layer GI. Optionally, a respective data line of the plurality of data lines DL is connected to the data signal connecting pad DCP through the third via v3. The data signal connecting pad DCP is connected to a first electrode S2 of the second transistor through the fourth via v4.

Referring to FIG. 2A, FIG. 2B, FIG. 3A to FIG. 3I, and FIG. 4B, in some embodiments, the array substrate further includes a fifth via v5, a sixth via v6, a seventh via v7, and an eighth via v8. The fifth via v5 extends through the first planarization layer PLN1. The sixth via v6 and the seventh via v7 respectively extend through the inter-layer dielectric layer ILD. The eighth via v8 extends through the inter-layer dielectric layer ILD, the insulating layer IN, and the gate insulating layer GI. Optionally, a respective second voltage supply line of the plurality of second voltage supply lines Vdd2 is connected to a respective first voltage supply line of the plurality of first voltage supply lines Vdd1 through the fifth via v5. Optionally, the respective first voltage supply line of the plurality of first voltage supply lines Vdd1 is connected to the second capacitor electrode Ce2 of the storage capacitor Cst through one or more vias (e.g., the sixth via v6 and the seventh via v7). Optionally, the respective first voltage supply line of the plurality of first voltage supply lines Vdd1 is connected to a first electrode S4 of the fourth transistor T4 through the eighth via v8.

Referring to FIG. 3A, FIG. 3E, and FIG. 4A, the second capacitor electrode Ce2 in some embodiment includes a main body MB and an extension E extending away from the main body MB. In some embodiments, the extension E includes a first portion P1, a second portion P2, and a third portion P3. The first portion P1 connects the main body MB with the second portion P2, the second portion P2 connects the first portion P1 with the third portion P3. Optionally, the first portion P1 and the third portion P3 extend along a direction substantially parallel to the second direction DR2, respectively. Optionally, the second portion P2 extends along a direction substantially parallel to the first direction DR1.

Figure 5A:
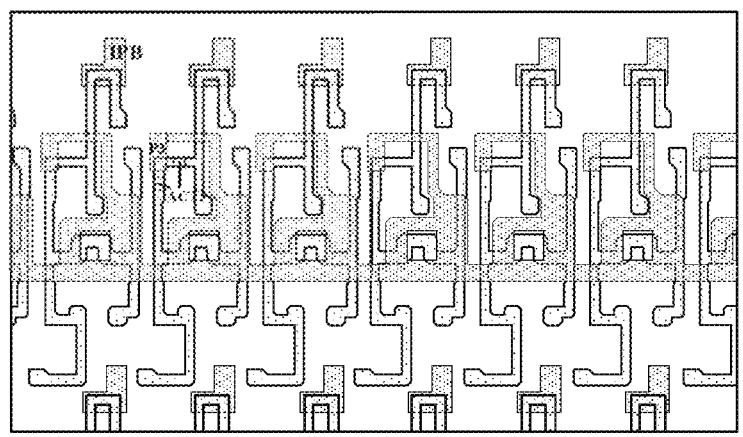
FIG. 5A is a schematic diagram illustrating the structure of a semiconductor material layer and a second conductive layer in some embodiments according to the present disclosure.
Figure 5B:
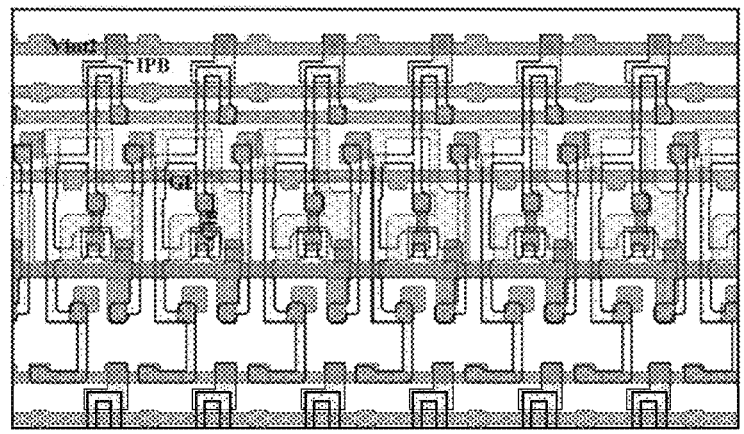
FIG. 5B is a diagram illustrating the structure of a semiconductor material layer, a second conductive layer, and a first signal line layer in an array substrate in some embodiments according to the present disclosure.

FIG. 5A is a schematic diagram illustrating the structure of a semiconductor material layer and a second conductive layer in some embodiments according to the present disclosure. FIG. 5B is a diagram illustrating the structure of a semiconductor material layer, a second conductive layer, and a first signal line layer in an array substrate in some embodiments according to the present disclosure. Referring to FIG. 3A, FIG. 3E, FIG. 4A, FIG. 5A, and FIG. 5B, in some embodiments, an orthographic projection of the third portion P3 on a base substrate BS at least partially overlaps with an orthographic projection of a portion of the semiconductor material layer between two active layer portions (e.g., two channel parts) of the third transistor T3 on the base substrate BS. The inventors of the present disclosure discover that this unique structure enhances stability of the third transistor T3.

Figure 5C:
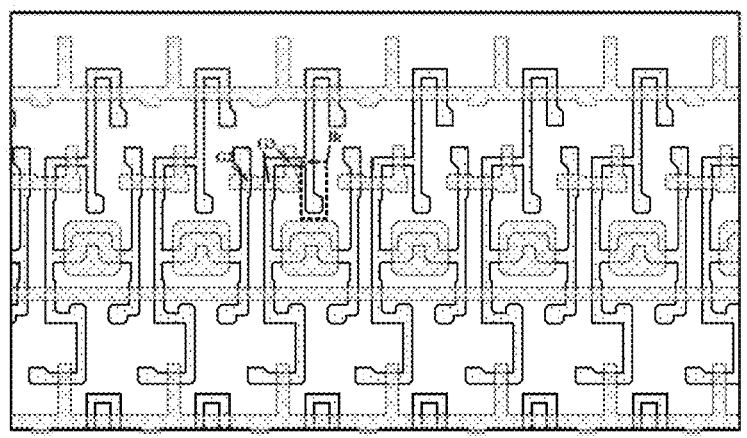
FIG. 5C is a schematic diagram illustrating the structure of a semiconductor material layer and a first conductive layer in some embodiments according to the present disclosure.

FIG. 5C is a schematic diagram illustrating the structure of a semiconductor material layer and a first conductive layer in some embodiments according to the present disclosure. Referring to FIG. 3C, FIG. 3D, FIG. 3G, in some embodiments, the semiconductor material layer includes a branch Br branching from a continuous line comprising the active layer ACT3 and the second electrode D3 of the third transistor T3, and the second electrode D1 of the first transistor T2. The branch Br is connected to a node connecting line Cln. Optionally, an orthographic projection of the branch Br on a base substrate is non-overlapping with is an orthographic projection of an electrode block comprising the gate electrode G2 of the second transistor T2 and the gate electrode G3 of the third transistor T3 on the base substrate. The electrode block comprising the gate electrode G2 of the second transistor T2 and the gate electrode G3 of the third transistor T3 is a unitary structure. By having the branch Br, electrode blocks (each comprising the gate electrode G2 of the second transistor T2 and the gate electrode G3 of the third transistor T3) in the first conductive layer can be connected to a respective gate line of the plurality of gate lines GL in the first signal line layer.

Figure 6A:
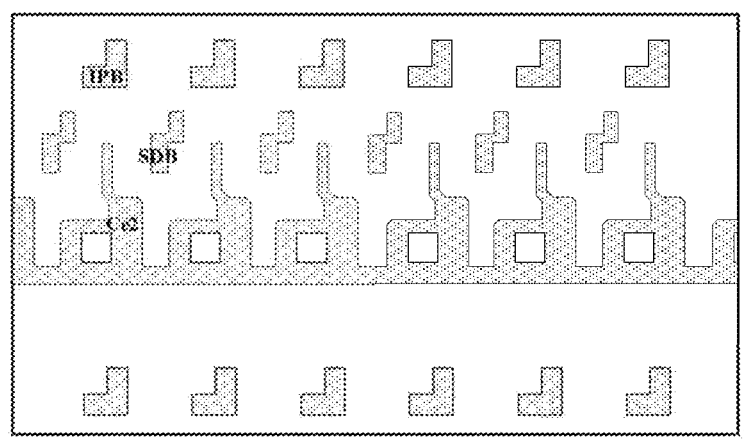
FIG. 6A is a diagram illustrating the structure of a second conductive layer in an array substrate in some embodiments according to the present disclosure.
Figure 6B:
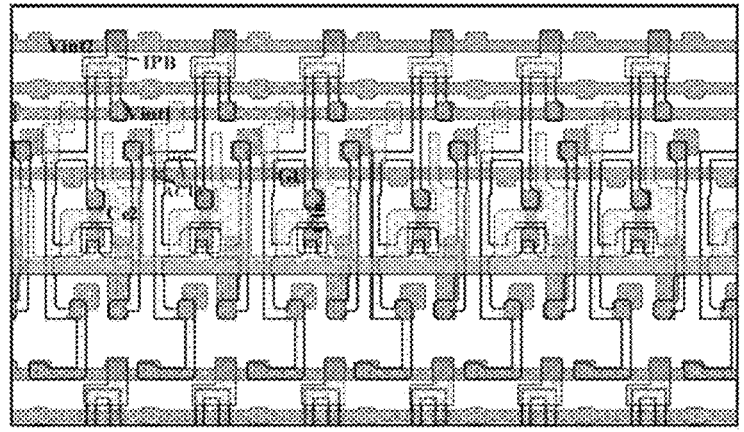
FIG. 6B is a diagram illustrating the structure of a semiconductor material layer, a second conductive layer, and a first signal line layer in an array substrate in some embodiments according to the present disclosure.

Various appropriate alternative implementations may be practiced to enhance the stability of the third transistor T3. FIG. 6A is a diagram illustrating the structure of a second conductive layer in an array substrate in some embodiments according to the present disclosure. FIG. 6B is a diagram illustrating the structure of a semiconductor material layer, a second conductive layer, and a first signal line layer in an array substrate in some embodiments according to the present disclosure. Referring to FIG. 6A and FIG. 6B, the second conductive layer in some embodiments includes a shielding block SDB. Optionally, the shielding block SDB is connected to a respective first reset signal line of the plurality of first reset signal lines Vint1. Optionally, the shielding block SDB is configured to receive a reset signal. In some embodiments, an orthographic projection of the shielding block SDB on a base substrate BS at least partially overlaps with an orthographic projection of a portion of the semiconductor material layer between two active layer portions (e.g., two channel parts) of the third transistor T3 on the base substrate BS. The inventors of the present disclosure discover that this unique structure enhances stability of the third transistor T3.

Referring to FIG. 3A, FIG. 3C, FIG. 3E, FIG. 3G, FIG. 5B, and FIG. 6B, the array substrate in some embodiments further includes an interference prevention block IPB.

Optionally, the interference prevention block IPB is in the second conductive layer. Optionally, the interference prevention block IPB is in a same layer as the second capacitor electrode Ce2. Optionally, the interference prevention block IPB is connected to a respective second reset signal line of the plurality of second reset signal lines Vint2. Optionally, the interference prevention block IPB is configured to receive a reset signal. In some embodiments, an orthographic projection of the interference prevention block IPB on a base substrate at least partially overlaps with an orthographic projection of a portion of the semiconductor material layer between two active layer portions (e.g., two channel parts) of the first transistor T1 on the base substrate. Optionally, the orthographic projection of the portion of the semiconductor material layer between two active layer portions (e.g., two channel parts) of the first transistor T1 on the base substrate is non-overlapping with an orthographic projection of any reset signal line on the base substrate. The inventors of the present disclosure discover that this unique structure enhances stability of the first transistor T1.

Referring to FIG. 3A, FIG. 3C, FIG. 3E, FIG. 3G, FIG. 4A, FIG. 5B, and FIG. 6B, in some embodiments, the node connecting line Cln is connected to the second electrode D3 of the third transistor T3 at a position between a respective gate line of the plurality of gate lines GI and capacitor electrodes of the storage capacitor. Optionally, an orthographic projection of the node connecting line Cln on a base substrate BS is non-overlapping with an orthographic projection of the respective gate line of the plurality of gate lines GL on the base substrate BS. Optionally, an orthographic projection of the second electrode D3 of the third transistor T3 on the base substrate BS partially overlaps with the orthographic projection of the respective gate line of the plurality of gate lines GL on the base substrate BS. The inventors of the present disclosure discover that this unique structure reduces or prevents interference from gate scanning signals transmitted in the respective gate line to the node connecting line Cln (corresponding to the first node N1). Moreover, a length of the node connecting line Cn can be reduced, reducing the potential interference from data signals transmitted in a respective data line of the plurality of data lines SL to the node connecting line Cln (corresponding to the first node N1).

Referring to FIG. 3A, FIG. 3C, FIG. 3E, FIG. 3G, and FIG. 3I, in some embodiments, the second capacitor electrode Ce2 spaces apart the first node N1 in a respective pixel driving circuit from the respective data line of the plurality of data lines DL configured to provide data signal to the respective pixel driving circuit. In some embodiments, the second capacitor electrode Ce2 spaces apart the node connecting line Cln from the respective data line of the plurality of data lines DL configured to provide data signal to the respective pixel driving circuit. In some embodiments, the second capacitor electrode Ce2 includes an extension E; and the extension E spaces apart the second electrode D3 of the third transistor T3 (connected to the node connecting line Cln) from the respective data line of the plurality of data lines DL configured to provide data signal to the respective pixel driving circuit. The inventors of the present disclosure discover that this unique structure reduces interference from data signals transmitted in a respective data line of the plurality of data lines SL to the node connecting line Cln (corresponding to the first node N1) and to the second electrode D3 of the third transistor T3.

Referring to FIG. 3A, FIG. 3C, FIG. 3D, and FIG. 3G, in some embodiments, a gate electrode (e.g., G1) of a first reset transistor (e.g., T1) in a present row of pixel driving circuits and a gate electrode (e.g., G6) of a second reset transistor (e.g., T6) in a previous row of pixel driving circuits are configured to receive a same reset control signal.

In some embodiments, at least a portion of a gate electrode (e.g., G1) of a first reset transistor (e.g., T1) in a present row of pixel driving circuits and at least a portion of a gate electrode (e.g., G6) of a second reset transistor (e.g., T6) in a previous row of pixel driving circuits are parts of a unitary structure. Optionally, the at least the portion of the gate electrode (e.g., G1) of the first reset transistor (e.g., T1) in the present row of pixel driving circuits and the at least the portion of the gate electrode (e.g., G6) of the second reset transistor (e.g., T6) in the previous row of pixel driving circuits are parts of a same reset control signal line.

In some embodiments, a respective first reset control signal line of the plurality of first reset control signal lines (e.g., a first reset control signal line in the present stage rst1N) includes a main line portion extending along a direction substantially parallel to the first direction DR), and a protrusion P protruding away from the main line portion MLP along a direction substantially parallel to the second direction DR2. The protrusion P protrudes away from the present row of pixel driving circuits toward the previous row of pixel driving circuits. Optionally, the protrusion P includes the at least the portion of the gate electrode (e.g., G6) of the second reset transistor (e.g., T6) in the previous row of pixel driving circuits. Optionally, the main line portion MLP includes the at least the portion of the gate electrode (e.g., G1) of the first reset transistor (e.g., T1) in the present row of pixel driving circuits.

In some embodiments, gate electrodes of the first reset transistor (e.g., T1) in the present row of pixel driving circuits and the second reset transistor (e.g., T6) in the previous row of pixel driving circuits are arranged along a direction non-parallel to an extension direction of reset control signal lines of the array substrate. Optionally, the gate electrodes of the first reset transistor (e.g., T1) in the present row of pixel driving circuits and the second reset transistor (e.g., T6) in the previous row of pixel driving circuits are arranged along a direction non-parallel to the first direction DR1.

In some embodiments, the gate electrode of the first reset transistor (e.g., T1) includes a first portion from a respective first reset control signal line of the plurality of first reset control signal lines and a second portion from a respective second reset control signal line of the plurality of second reset control signal lines.

In some embodiments, an orthographic projection of the respective first reset control signal line of the plurality of first reset control signal lines on a base substrate at least partially overlaps with an orthographic projection of the respective second reset control signal line of the plurality of second reset control signal lines on the base substrate.

In some embodiments, an orthographic projection of the first portion of the gate electrode of the first reset transistor from the respective first reset control signal line of the plurality of first reset control signal lines on a base substrate at least partially overlaps with an orthographic projection of the second portion of the gate electrode of the first reset transistor from the respective second reset control signal line of the plurality of second reset control signal lines on the base substrate.

The inventors of the present disclosure discover that, by having two reset control signal lines for providing reset control signals, resistance of the reset control signal lines can be reduced, and the driving power of the reset control signal lines can be ensured. By having this unique structure, the first reset transistor and the second reset transistor can share a same reset control signal generated by a same reset control generating circuit. A total number of the scan circuits can be reduced, and a peripheral area of the array substrate can be further reduced.

Referring to FIG. 3A, FIG. 3D, FIG. 3G, in some embodiments, along a second direction DR2, a first reset signal line of the plurality of first reset signal lines Vint1 configured to provide reset signals to the first reset transistor (e.g., T1) in the present row of pixel driving circuits and a second reset signal line of the plurality of second reset signal lines Vint2 configured to provide reset signals to the second reset transistor (e.g., T6) in the previous row of pixel driving circuits are on two sides of a second reset control signal line of the plurality of second reset control signal lines configured to provide reset control signals to the first reset transistor (e.g., T1) in the present row of pixel driving circuits. Optionally, the second reset control signal line of the plurality of second reset control signal lines configured to provide reset control signals to the first reset transistor (e.g., T1) in the present row of pixel driving circuits spaces apart the first reset signal line of the plurality of first reset signal lines Vint1 configured to provide reset signals to the first reset transistor (e.g., T1) in the present row of pixel driving circuits and the second reset signal line of the plurality of second reset signal lines Vint2 configured to provide reset signals to the second reset transistor (e.g., T6) in the previous row of pixel driving circuits.

Referring to FIG. 3A, FIG. 3D, FIG. 3G, in some embodiments, along a second direction DR2, a first reset signal line of the plurality of first reset signal lines Vint1 configured to provide reset signals to the first reset transistor (e.g., T1) in the present row of pixel driving circuits and a second reset signal line of the plurality of second reset signal lines Vint2 configured to provide reset signals to the second reset transistor (e.g., T6) in the previous row of pixel driving circuits are on two sides of a main line portion of a first reset control signal line of the plurality of first reset control signal lines configured to provide reset control signals to the first reset transistor (e.g., T1) in the present row of pixel driving circuits and the second reset transistor (e.g., T6) in the previous row of pixel driving circuits. Optionally, the main line portion of the first reset control signal line of the plurality of first reset control signal lines configured to provide reset control signals to the first reset transistor (e.g., T1) in the present row of pixel driving circuits and the second reset transistor (e.g., T6) in the previous row of pixel driving circuits spaces apart the first reset signal line of the plurality of first reset signal lines Vint1 configured to pro-vide reset signals to the first reset transistor (e.g., T1) in the present row of pixel driving circuits and the second reset signal line of the plurality of second reset signal lines Vint2 configured to provide reset signals to the second reset transistor (e.g., T6) in the previous row of pixel driving circuits.

In some embodiments, an orthographic projection of reset signal line in the array substrate on a base substrate is non-overlapping with an orthographic projection of any main line portion of any reset control signal lines in the array substrate on the base substrate. Interference of reset control signals to the reset signal lines can be reduced.

Referring to FIG. 3A, FIG. 3C, FIG. 3D, and FIG. 3G, in some embodiments, a gate electrode (e.g., G3) of a compensating transistor (e.g., T3) in a present column of pixel driving circuits and a gate electrode (e.g., G2) of a data write transistor (e.g., T2) in a previous column of pixel driving circuits are configured to receive a same gate scanning signal, e.g., generated by a same gate scanning circuit. By having this unique structure, the data write transistor and the compensating transistor can share a same gate scanning signal generated by a same gate scanning circuit (e.g., a same gate-on-array circuit). A total number of the scan circuits can be reduced, and a peripheral area of the array substrate can be further reduced.

In some embodiments, at least a portion of a gate electrode (e.g., G3) of a compensating transistor (e.g., T3) in a present column of pixel driving circuits and at least a portion of a gate electrode (e.g., G2) of a data write transistor (e.g., T2) in a previous column of pixel driving circuits are parts of a unitary structure (e.g., a unitary electrode block). Optionally, the unitary structure comprising the at least the portion of the gate electrode (e.g., G3) of the compensating transistor (e.g., T3) in the present column of pixel driving circuits and the at least the portion of the gate electrode (e.g., G2) of the data write transistor (e.g., T2) in the previous column of pixel driving circuits is connected to a gate line of the plurality of gate lines GL. Optionally, the unitary structure comprising the at least the portion of the gate electrode (e.g., G3) of the compensating transistor (e.g., T3) in the present column of pixel driving circuits and the at least the portion of the gate electrode (e.g., G2) of the data write transistor (e.g., T2) in the previous column of pixel driving circuits is in the first conductive layer, and the plurality of gate lines GL are in the first signal line layer.

Figure 7A:
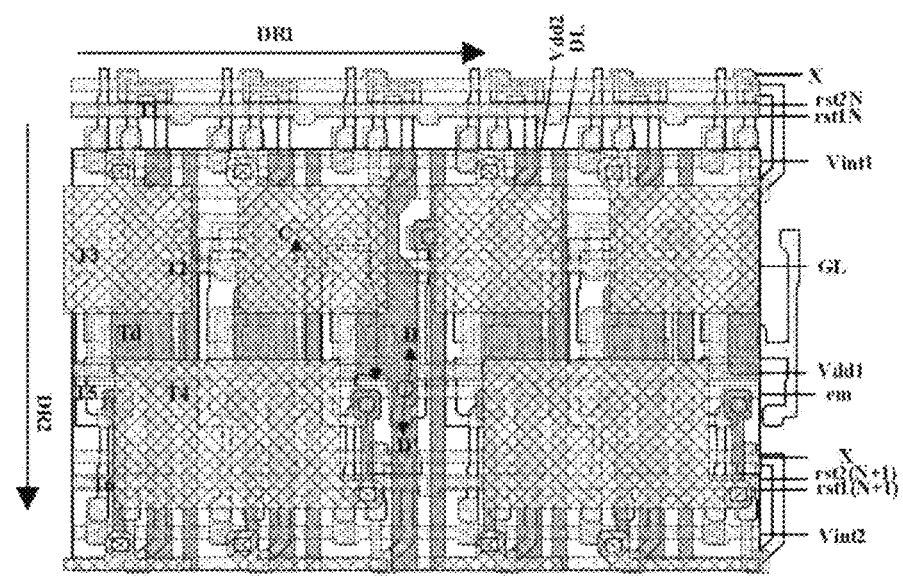
FIG. 7A is a diagram illustrating the structure of an array substrate in some embodiments according to the present disclosure.
Figure 7B:
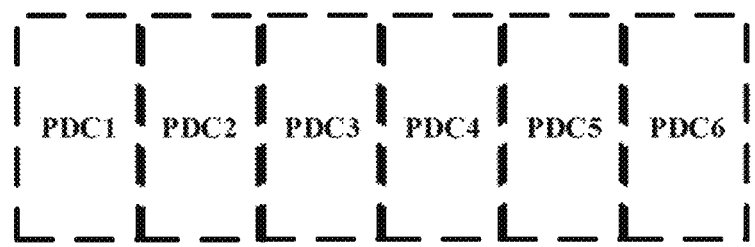
FIG. 7B is a schematic diagram illustrating an arrangement of a plurality of pixel driving circuits in an array substrate depicted in FIG. 7A.
Figure 7C:
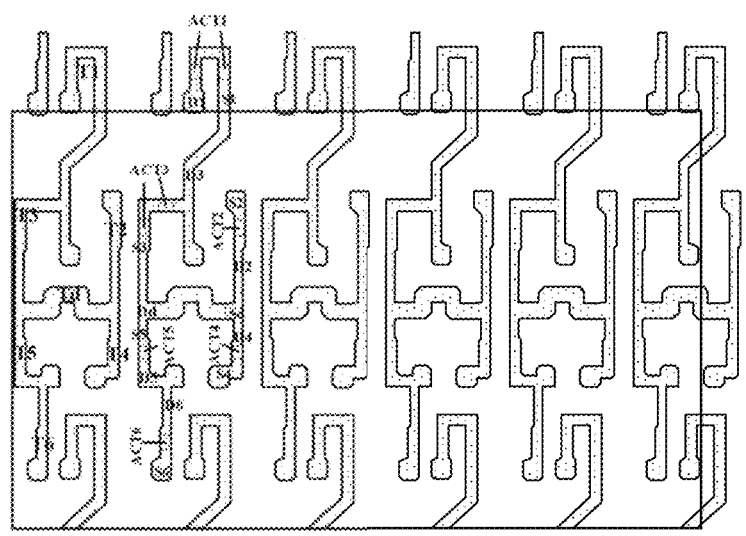
FIG. 7C is a diagram illustrating the structure of a semiconductor material layer in an array substrate depicted in FIG. 7A.
Figure 7D:
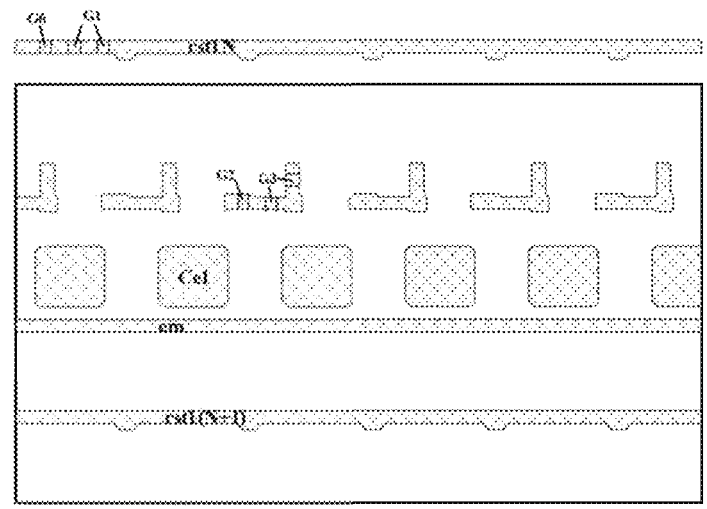
FIG. 7D is a diagram illustrating the structure of a first conductive layer in an array substrate depicted in FIG. 7A.
Figure 7E:
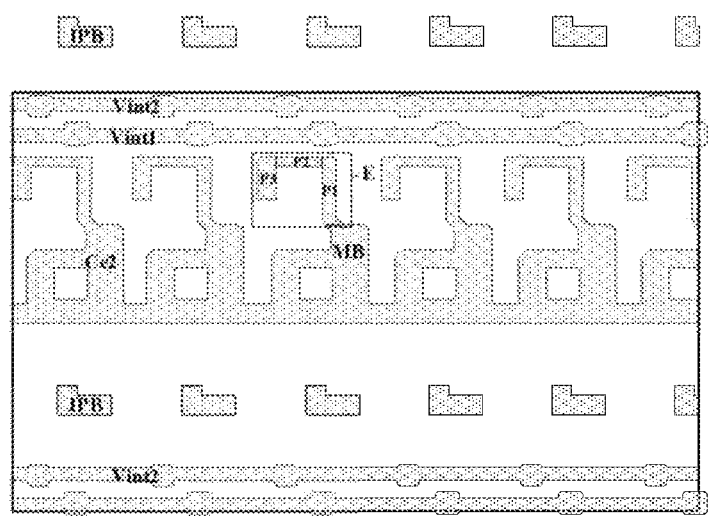
FIG. 7E is a diagram illustrating the structure of a second conductive layer in an array substrate depicted in FIG. 7A.
Figure 7F:
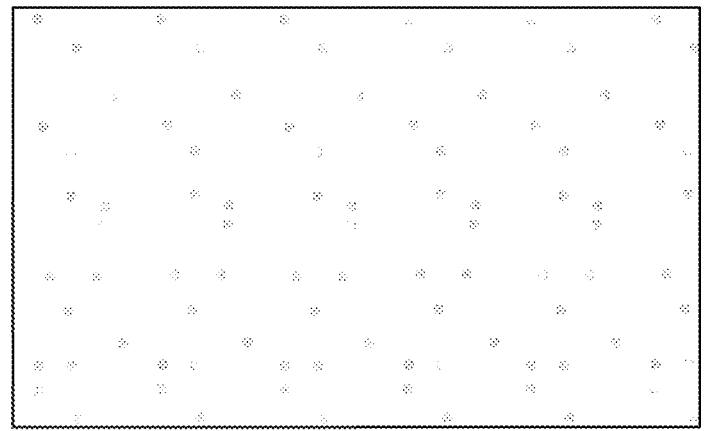
FIG. 7F is a diagram illustrating the structure of an inter-layer dielectric layer in an array substrate depicted in FIG. 7A.
Figure 7G:
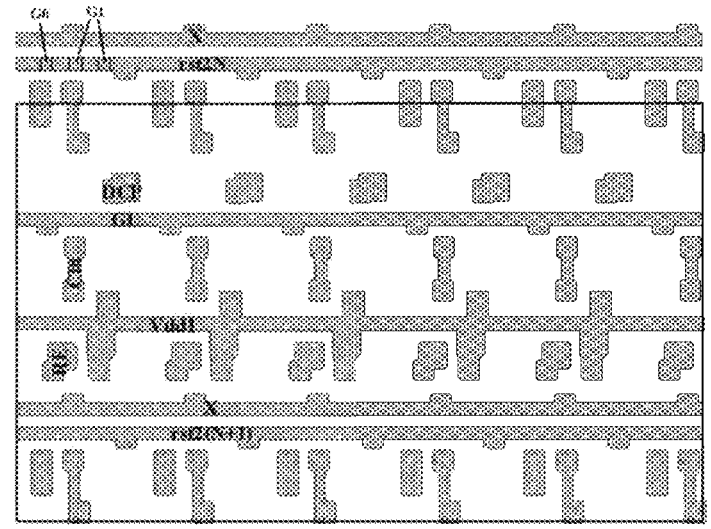
FIG. 7G is a diagram illustrating the structure of a first signal line layer in an array substrate depicted in FIG. 7A.
Figure 7H:
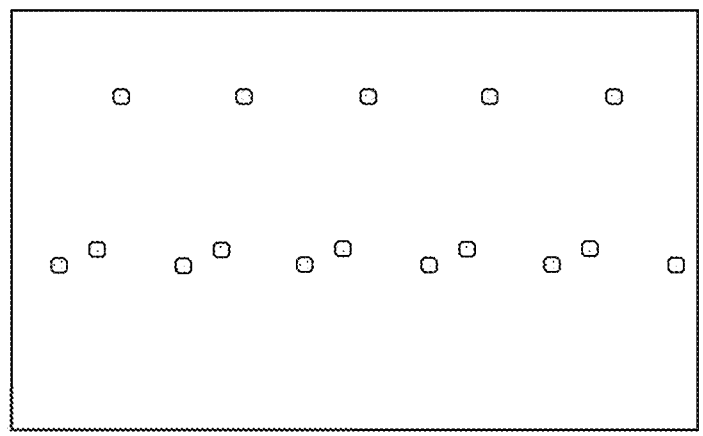
FIG. 7H is a diagram illustrating the structure of a first planarization layer in an array substrate depicted in FIG. 7A.
Figure 7I:
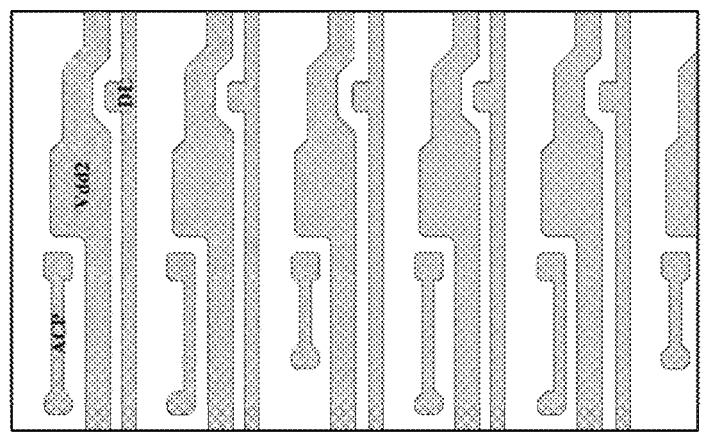
FIG. 7I is a diagram illustrating the structure of a second signal line layer in an array substrate depicted in FIG. 7A.
Figure 7J:
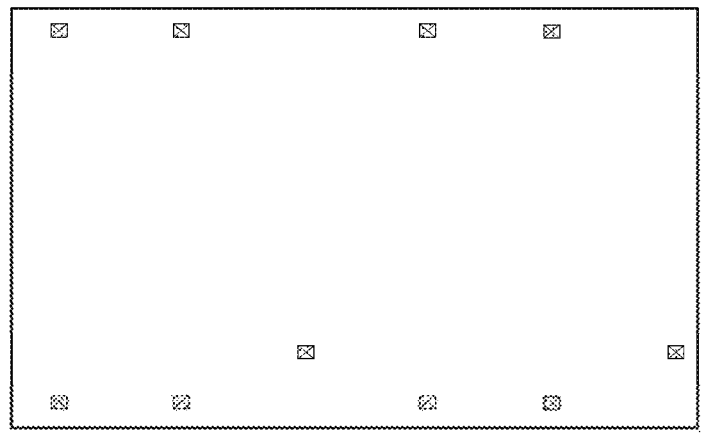
FIG. 7J is a diagram illustrating the structure of a second planarization layer in an array substrate depicted in FIG. 7A.
Figure 7K:
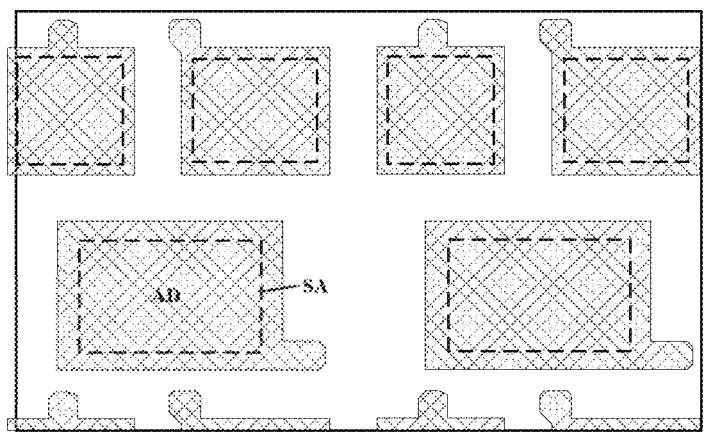
FIG. 7K is a diagram illustrating the structure of an anode layer in an array substrate depicted in FIG. 7A.
Figure 7L:
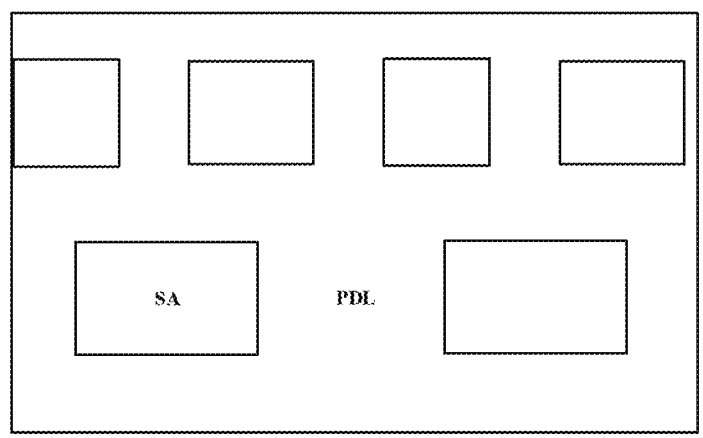
FIG. 7L is a diagram illustrating the structure of a pixel definition layer in an array substrate depicted in FIG. 7A.
Figure 8A:
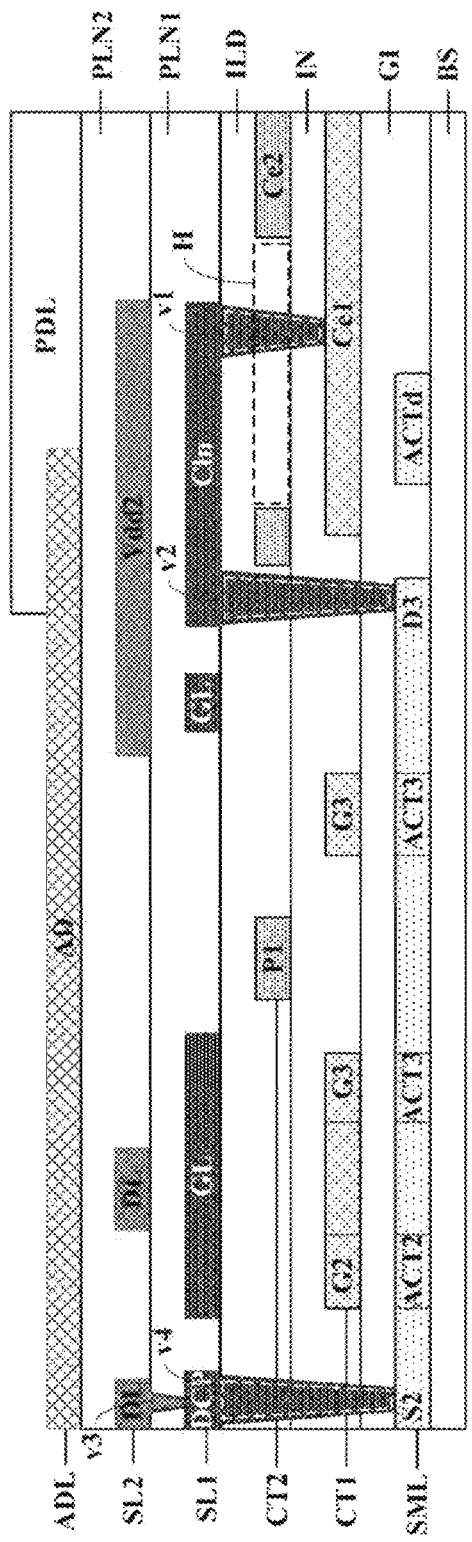
FIG. 8A is a cross-sectional view along a C-C' line in FIG. 7A.
Figure 8B:
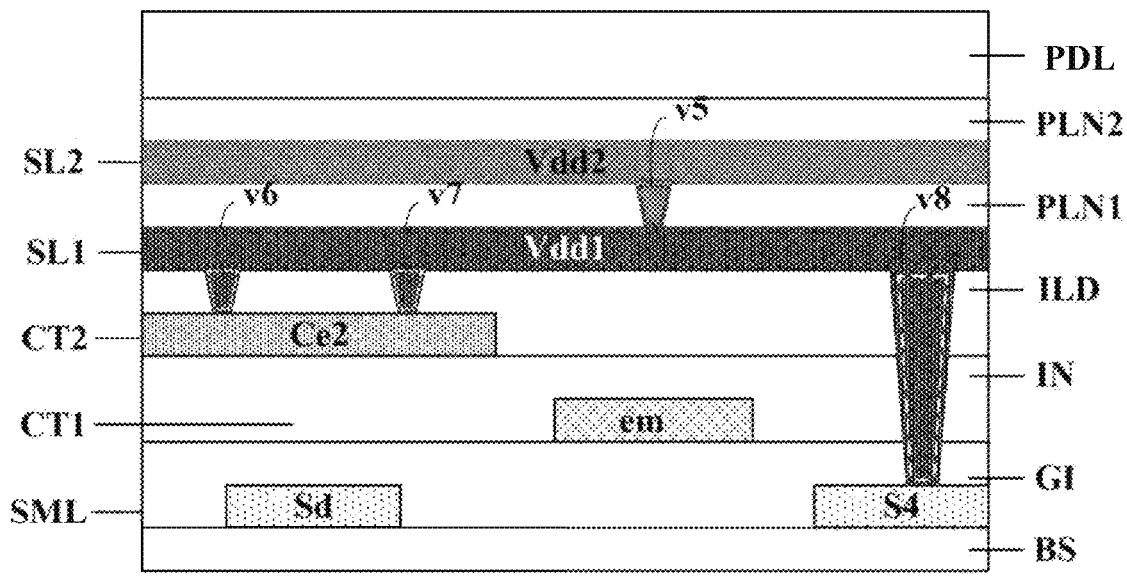
FIG. 8B is a cross-sectional view along a D-D' line in FIG. 7A.

FIG. 7A is a diagram illustrating the structure of an array substrate in some embodiments according to the present disclosure. FIG. 7B is a schematic diagram illustrating an arrangement of a plurality of pixel driving circuits in an array substrate depicted in FIG. 7A. FIG. 7C is a diagram illustrating the structure of a semiconductor material layer in an array substrate depicted in FIG. 7A. FIG. 7D is a diagram illustrating the structure of a first conductive layer in an array substrate depicted in FIG. 7A. FIG. 7E is a diagram illustrating the structure of a second conductive layer in an array substrate depicted in FIG. 7A. FIG. 7F is a diagram illustrating the structure of an inter-layer dielectric layer in an array substrate depicted in FIG. 7A. FIG. 7G is a diagram illustrating the structure of a first signal line layer in an array substrate depicted in FIG. 7A. FIG. 7H is a diagram illustrating the structure of a first planarization layer in an array substrate depicted in FIG. 7A. FIG. 7I is a diagram illustrating the structure of a second signal line layer in an array substrate depicted in FIG. 7A. FIG. 7J is a diagram illustrating the structure of a second planarization layer in an array substrate depicted in FIG. 7A. FIG. 7K is a diagram illustrating the structure of an anode layer in an array substrate depicted in FIG. 7A. FIG. 7L is a diagram illustrating the structure of a pixel definition layer in an array substrate depicted in FIG. 7A. FIG. 8A is a cross-sectional view along a C-C' line in FIG. 7A. FIG. 8B is a cross-sectional view along a D-D' line in FIG. 7A.

Referring to FIG. 2A, FIG. 2B, FIG. 7A, and FIG. 7C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The driving transistor Td includes an active layer ACTd, a first electrode Sd, and a second electrode Dd. In one example, the active layers (ACT1, ACT2, ACT3, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT3, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the first electrodes (S1, S2, S3, S4, S5, S6, and Sd), and the second electrodes (D1, D2, D3, D4, D5, D6, and Dd) of the transistors (T1, T2, T3, T4, T5, T6, and Td) are in a same layer.

Referring to FIG. 2A, FIG. 2B, FIG. 7A, and FIG. 7D, the first conductive layer in some embodiments includes a plurality of first reset control signal lines rst1 (including a first reset signal line in a present stage rst1N and a first reset signal line in a next stage rst1(N+0)), a plurality of light emitting control signal lines em, an electrode block comprising one or more gate electrodes G3 of the third transistor T3 and a gate electrode G2 of the second transistor T2, and a first capacitor electrode Ce1 of the storage capacitor Cst.

Referring to FIG. 2A, FIG. 2B, FIG. 7A, and FIG. 7E, the second conductive layer in some embodiments includes a plurality of first reset signal lines Vint1, an interference prevention block IPB, and a second capacitor electrode Ce2 of the storage capacitor Cst.

Vias extending through the inter-layer dielectric layer ILD are depicted in FIG. 7F.

Referring to FIG. 2A, FIG. 2B, FIG. 7A, and FIG. 7G, the first signal line layer in some embodiments includes a node connecting line Cln, a plurality of constant voltage signal lines X, a plurality of second reset control signal lines rst2 (including a second reset control signal line in a present stage rst2N and a second reset control signal line in a next stage rst2(N+1)), a plurality of gate lines GL, a plurality of first voltage supply lines Vdd1, a relay electrode RE, and a data signal connecting pad DCP. The node connecting line Cln connects the first capacitor electrode Ce1 and the first electrode of the driving transistor Td in a respective pixel driving circuit together. The data signal connecting pad DCP is configured to connect a respective data line of the plurality of data lines to a first electrode of the second transistor T2. The relay electrode RE connects the fourth node N4 and an anode contact pad together. The relay electrode is connected to second electrodes of the fifth transistor T5 and the sixth transistor T6. The anode contact pad is in the second signal line layer, and is connected to an anode in a respective subpixel. The plurality of first voltage supply lines Vdd1 are interconnected with a plurality of second voltage supply lines, forming an interconnected reset signal network. A respective first voltage supply line of the plurality of first voltage supply lines Vdd1 is connected to a first electrode of the fourth transistor T4, and connected to the second capacitor electrode Ce2 of the storage capacitor Cst. Optionally, the plurality of first voltage supply lines Vdd1 extend along a direction substantially parallel to a first direction DR1; the plurality of second voltage supply lines extend along a direction substantially parallel to a second direction DR2.

In some embodiments, the plurality of constant voltage signal lines X may be configured to transmit any appropriate constant voltage signals, for example, a first reference voltage signal (a high reference voltage signal) or a second reference voltage signal (a low reference voltage signal). Optionally, the first reference voltage signal is a constant voltage signal, the second reference voltage signal is a constant voltage signal, the first reference voltage signal has a voltage level higher than a voltage level of the second reference voltage signal.

In some embodiments, a respective constant voltage signal line of the plurality of constant voltage signal lines X in the first signal line layer is connected to the interference prevention block IPB in the second conductive layer, and is configured to provide a constant voltage signal to the interference prevention block IPB.

Vias extending through the first planarization layer PLN1 are depicted in FIG. 7H.

Referring to FIG. 2A, FIG. 2B, FIG. 7A, and FIG. 7I, the second signal line layer in some embodiments includes a plurality of second voltage supply lines Vdd2, a plurality of data line DL, and an anode contact pad ACP. The anode contact pad ACP is electrically connected to second electrodes of the fifth transistor T5 and the sixth transistor T6 in the respective pixel driving circuit through a relay electrode. The anode contact pad ACP is electrically connected to an anode in a respective subpixel. The plurality of second voltage supply lines Vdd2 are interconnected with a plurality of first voltage supply lines, forming an interconnected reset signal network. A respective data line of the plurality of data lines is electrically connected to a first electrode of the second transistor 2 through a data signal connecting pad.

Vias extending through the second planarization layer PLN2 are depicted in FIG. 7.

Referring to FIG. 2A, FIG. 2B, FIG. 7A, and FIG. 7K, the array substrate further includes an anode layer ADL. A plurality of subpixel apertures SA respectively corresponding to a plurality of anodes are denoted in FIG. 7K. Vias extending through the second planarization layer PLN2 are depicted in FIG. 7J. A respective anode is connected to a respective anode contact pad through a respective via extending through the second planarization layer PLN2.

Referring to FIG. 2A, FIG. 2B, FIG. 7A, and FIG. 7L, the array substrate further includes a pixel definition layer PDL defining a plurality of subpixel apertures SA.

Referring to FIG. 2A, FIG. 2B, FIG. 7A, FIG. 7D, FIG. 7E, FIG. 7G, and FIG. 8A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line Cln on a side of the inter-layer dielectric layer ILD away from the second capacitor electrode Ce2. The node connecting line Cln is in a same layer as at least one of the plurality of constant voltage signal lines X, the plurality of first reset control signal lines rst1, the plurality of second reset control signal lines rst2, the plurality of gate lines GL, the plurality of first voltage supply lines Vdd1, the relay electrode RE, or the data signal connecting pad DCP.

In some embodiments, the first capacitor electrode Ce1 is on a side of the gate insulating layer GI away from the base substrate BS. Optionally, the array substrate further includes a first via v1 and a second via v2. The first via v1 is in the hole region H and extends through the inter-layer dielectric layer ILD and the insulating layer IN. The second via v2 extends through the inter-layer dielectric layer ILD, the insulating layer IN, and the gate insulating layer G. Optionally, the node connecting line Cln is connected to the first capacitor electrode Ce1 through the first via v1, and the node connecting line Cln is connected the semiconductor material layer SML through the second via v2. Optionally, the node connecting line Cln is connected to the second electrode D3 of third transistor, as depicted in FIG. 8A.

In some embodiments, the array substrate further includes a third via v3 and a fourth via v4. The third via v3 extends through the first planarization layer PLN1. The fourth via v4 extends through the inter-layer dielectric layer ILD, the insulating layer IN, and the gate insulating layer GI. Optionally, a respective data line of the plurality of data lines DL is connected to the data signal connecting pad DCP through the third via v3. The data signal connecting pad DCP is connected to a first electrode S2 of the second transistor through the fourth via v4.

Referring to FIG. 2A, FIG. 2B, FIG. 7A to FIG. 7I, and FIG. 8B, in some embodiments, the array substrate further includes a fifth via v5, a sixth via v6, a seventh via v7, and an eighth via vg. The fifth via v5 extends through the first planarization layer PLN1. The sixth via v6 and the seventh via v7 respectively extend through the inter-layer dielectric layer ILD. The eighth via v8 extends through the inter-layer dielectric layer ILD, the insulating layer IN, and the gate insulating layer GI. Optionally, a respective second voltage supply line of the plurality of second voltage supply lines Vdd2 is connected to a respective first voltage supply line of the plurality of first voltage supply lines Vdd1 through the fifth via v5. Optionally, the respective first voltage supply line of the plurality of first voltage supply lines Vdd1 is connected to the second capacitor electrode Ce2 of the storage capacitor Cst through one or more vias (e.g., the sixth via v6 and the seventh via v7). Optionally, the respective first voltage supply line of the plurality of first voltage supply lines Vdd1 is connected to a first electrode S4 of the fourth transistor T4 through the eighth via v8.

Referring to FIG. 7A, FIG. 7E, and FIG. 8A, the second capacitor electrode Ce2 in some embodiment includes a main body MB and an extension E extending away from the main body MB. In some embodiments, the extension E includes a first portion P1, a second portion P2, and a third portion P3. The first portion P1 connects the main body MB with the second portion P2, the second portion P2 connects the first portion P1 with the third portion P3. Optionally, the first portion P1 and the third portion P3 extend along a direction substantially parallel to the second direction DR2, respectively. Optionally, the second portion P2 extends along a direction substantially parallel to the first direction DR1. In some embodiments, an orthographic projection of the third portion P3 on a base substrate BS at least partially overlaps with an orthographic projection of a portion of the semiconductor material layer between two active layer portions (e.g., two channel parts) of the third transistor T3 on the base substrate BS. The inventors of the present disclosure discover that this unique structure enhances stability of the third transistor T3.

Referring to FIG. 7A, FIG. 7C, FIG. 7E, and FIG. 7G, the array substrate in some embodiments further includes an interference prevention block IPB. Optionally, the interference prevention block IPB is in the second conductive layer. Optionally, the interference prevention block IPB is in a same layer as the second capacitor electrode Ce2. Optionally, the interference prevention block IPB is connected to a constant voltage signal line of the plurality of constant voltage signal lines X, and is configured to receive a constant voltage signal. In some embodiments, an orthographic projection of the interference prevention block IPB on a base substrate at least partially overlaps with an orthographic projection of a portion of the semiconductor material layer between two active layer portions (e.g., two channel parts) of the first transistor T1 on the base substrate. Optionally, the orthographic projection of the portion of the semiconductor material layer between two active layer portions (e.g., two channel parts) of the first transistor T1 on the base substrate is non-overlapping with an orthographic projection of any reset signal line on the base substrate. The inventors of the present disclosure discover that this unique structure enhances stability of the first transistor T1.

Referring to FIG. 7A, FIG. 7C, FIG. 7E, FIG. 7G, and FIG. 8A, in some embodiments, the node connecting line Cln is connected to the second electrode D3 of the third transistor T3 at a position between a respective gate line of the plurality of gate lines GL and capacitor electrodes of the storage capacitor. Optionally, an orthographic projection of the node connecting line Cln on a base substrate BS is non-overlapping with an orthographic projection of the respective gate line of the plurality of gate lines GL on the base substrate BS. Optionally, an orthographic projection of the second electrode D3 of the third transistor T3 on the base substrate BS partially overlaps with the orthographic projection of the respective gate line of the plurality of gate lines GL on the base substrate BS. The inventors of the present disclosure discover that this unique structure reduces or prevents interference from gate scanning signals transmitted in the respective gate line to the node connecting line Cln (corresponding to the first node N1). Moreover, a length of the node connecting line Cn can be reduced, reducing the potential interference from data signals transmitted in a respective data line of the plurality of data lines SL to the node connecting line Cln (corresponding to the first node N1).

Referring to FIG. 7A, FIG. 7C, FIG. 7E, FIG. 7G, and FIG. 7I in some embodiments, the second capacitor electrode Ce2 spaces apart the first node N1 in a respective pixel driving circuit from the respective data line of the plurality of data lines DL configured to provide data signal to the respective pixel driving circuit. In some embodiments, the second capacitor electrode Ce2 spaces apart the node connecting line Cln from the respective data line of the plurality of data lines DL configured to provide data signal to the respective pixel driving circuit. In some embodiments, the second capacitor electrode Ce2 includes an extension E; and the extension E spaces apart the second electrode D3 of the third transistor T3 (connected to the node connecting line Cln) from the respective data line of the plurality of data lines DL configured to provide data signal to the respective pixel driving circuit. The inventors of the present disclosure discover that this unique structure reduces interference from data signals transmitted in a respective data line of the plurality of data lines SL to the node connecting line Cln (corresponding to the first node N1) and to the second electrode D3 of the third transistor T3.

Referring to FIG. 7A, FIG. 7C, FIG. 7D, and FIG. 7G, in some embodiments, a gate electrode (e.g., G1) of a first reset transistor (e.g., T1) in a present row of pixel driving circuits and a gate electrode (e.g., G6) of a second reset transistor (e.g., T6) in a previous row of pixel driving circuits are configured to receive a same reset control signal.

In some embodiments, at least a portion of a gate electrode (e.g., G1) of a first reset transistor (e.g., T1) in a present row of pixel driving circuits and at least a portion of a gate electrode (e.g., G6) of a second reset transistor (e.g., T6) in a previous row of pixel driving circuits are parts of a unitary structure. Optionally, the at least the portion of the gate electrode (e.g., G1) of the first reset transistor (e.g., T1) in the present row of pixel driving circuits and the at least the portion of the gate electrode (e.g., G6) of the second reset transistor (e.g., T6) in the previous row of pixel driving circuits are parts of a same reset control signal line.

In some embodiments, gate electrodes of the first reset transistor (e.g., T1) in the present row of pixel driving circuits and the second reset transistor (e.g., T6) in the previous row of pixel driving circuits are arranged along a direction substantially parallel to an extension direction of reset control signal lines of the array substrate. Optionally, the gate electrodes of the first reset transistor (e.g., T1) in the present row of pixel driving circuits and the second reset transistor (e.g., T6) in the previous row of pixel driving circuits are arranged along a direction substantially parallel to the first direction DR1.

In some embodiments, the gate electrode of the first reset transistor (e.g., T1) includes a first portion from a respective first reset control signal line of the plurality of first reset control signal lines and a second portion from a respective second reset control signal line of the plurality of second reset control signal lines.

In some embodiments, an orthographic projection of the respective first reset control signal line of the plurality of first reset control signal lines on a base substrate at least partially overlaps with an orthographic projection of the respective second reset control signal line of the plurality of second reset control signal lines on a base substrate.

In some embodiments, an orthographic projection of the first portion of the gate electrode of the first reset transistor from the respective first reset control signal line of the plurality of first reset control signal lines on a base substrate at least partially overlaps with an orthographic projection of the second portion of the gate electrode of the first reset transistor from the respective second reset control signal line of the plurality of second reset control signal lines on the base substrate.

The inventors of the present disclosure discover that, by having two reset control signal lines for providing reset control signals, resistance of the reset control signal lines can be reduced, and the driving power of the reset control signal lines can be ensured. By having this unique structure, the first reset transistor and the second reset transistor can share a same reset control signal generated by a same reset control generating circuit. A total number of the scan circuits can be reduced, and a peripheral area of the array substrate can be further reduced.

Referring to FIG. 7A, FIG. 7C. FIG. 7D, and FIG. 7G, in some embodiments, a gate electrode (e.g., G3) of a compensating transistor (e.g., T3) in a present column of pixel driving circuits and a gate electrode (e.g., G2) of a data write transistor (e.g., T2) in a previous column of pixel driving circuits are configured to receive a same gate scanning signal, e.g., generated by a same gate scanning circuit. By having this unique structure, the data write transistor and the compensating transistor can share a same gate scanning signal generated by a same gate scanning circuit (e.g., a same gate-on-array circuit). A total number of the scan circuits can be reduced, and a peripheral area of the array substrate can be further reduced.

In some embodiments, at least a portion of a gate electrode (e.g., G3) of a compensating transistor (e.g., T3) in a present column of pixel driving circuits and at least a portion of a gate electrode (e.g., G2) of a data write transistor (e.g., T2) in a previous column of pixel driving circuits are parts of a unitary structure (e.g., a unitary electrode block). Optionally, the unitary structure comprising the at least the portion of the gate electrode (e.g., G3) of the compensating transistor (e.g., T3) in the present column of pixel driving circuits and the at least the portion of the gate electrode (e.g., G2) of the data write transistor (e.g., T2) in the previous column of pixel driving circuits is connected to a gate line of the plurality of gate lines GL. Optionally, the unitary structure comprising the at least the portion of the gate electrode (e.g., G3) of the compensating transistor (e.g., T3) in the present column of pixel driving circuits and the at least the portion of the gate electrode (e.g., G2) of the data write transistor (e.g., T2) in the previous column of pixel driving circuits is in the first conductive layer, and the plurality of gate lines GL are in the first signal line layer.

Figure 9A:
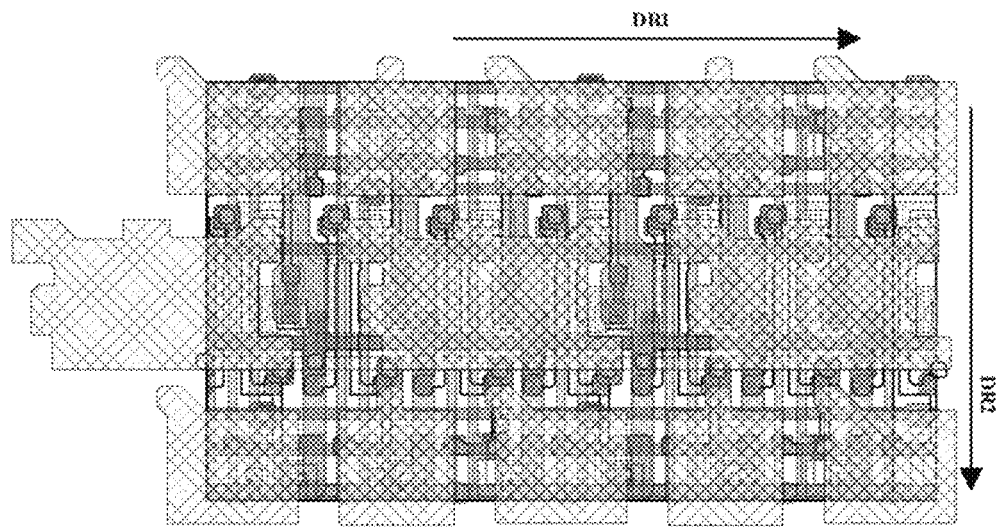
FIG. 9A is a diagram illustrating the structure of an array substrate in some embodiments according to the present disclosure.
Figure 9B:
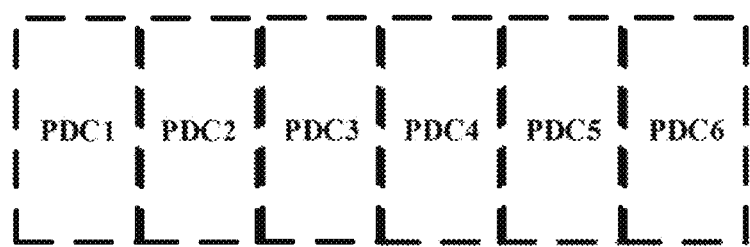
FIG. 9B is a schematic diagram illustrating an arrangement of a plurality of pixel driving circuits in an array substrate depicted in FIG. 9A.
Figure 9C:
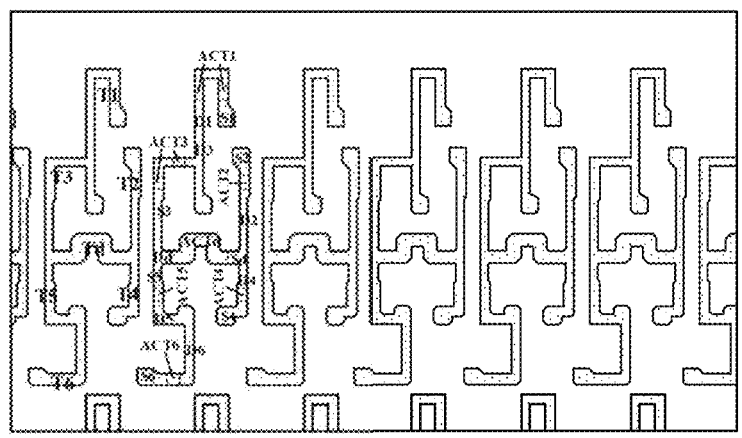
FIG. 9C is a diagram illustrating the structure of a semiconductor material layer in an array substrate depicted in FIG. 9A.
Figure 9D:
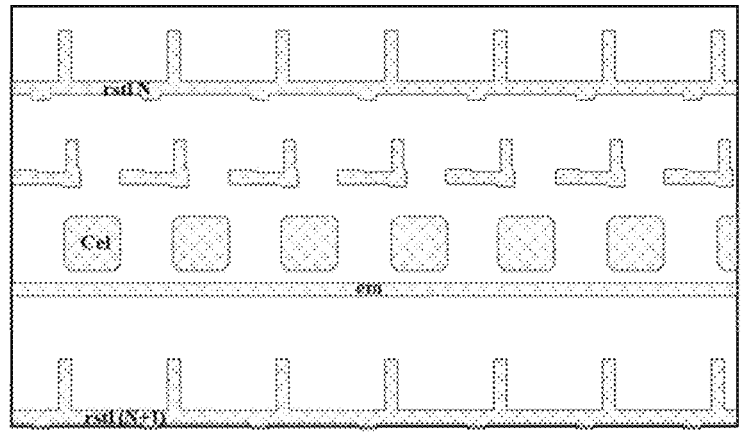
FIG. 9D is a diagram illustrating the structure of a first conductive layer in an array substrate depicted in FIG. 9A.
Figure 9E:
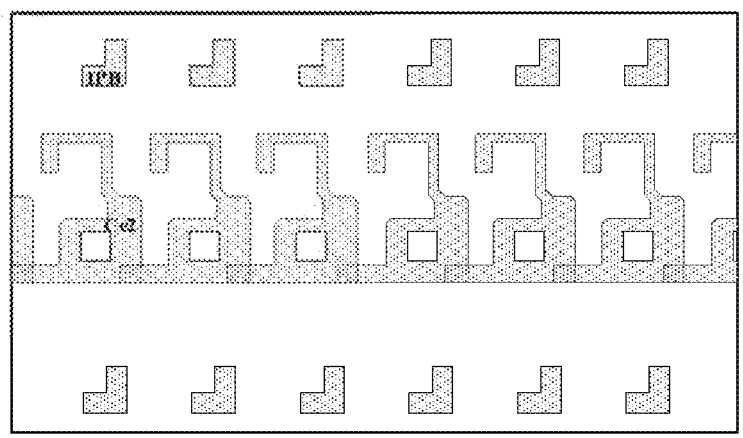
FIG. 9E is a diagram illustrating the structure of a second conductive layer in an array substrate depicted in FIG. 9A.
Figure 9F:
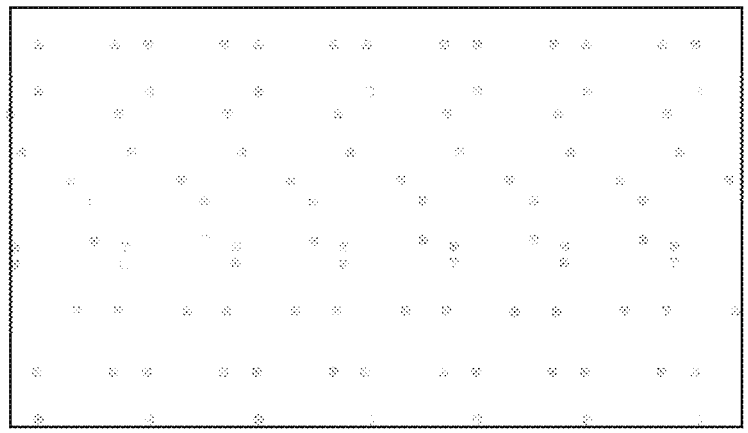
FIG. 9F is a diagram illustrating the structure of an inter-layer dielectric layer in an array substrate depicted in FIG. 9A.
Figure 9G:
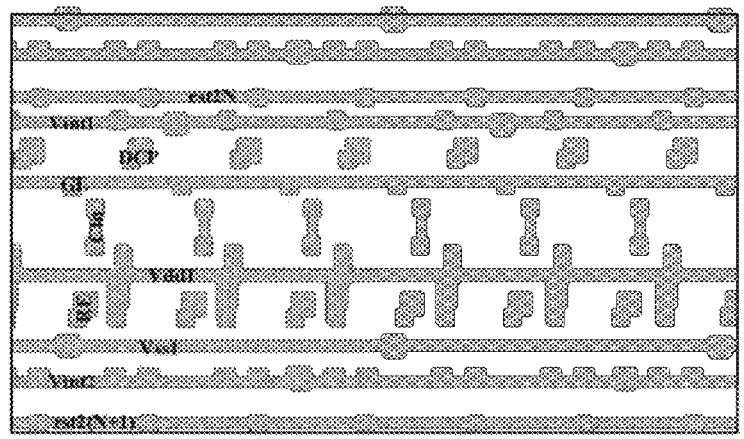
FIG. 9G is a diagram illustrating the structure of a first signal line layer in an array substrate depicted in FIG. 9A.
Figure 9H:
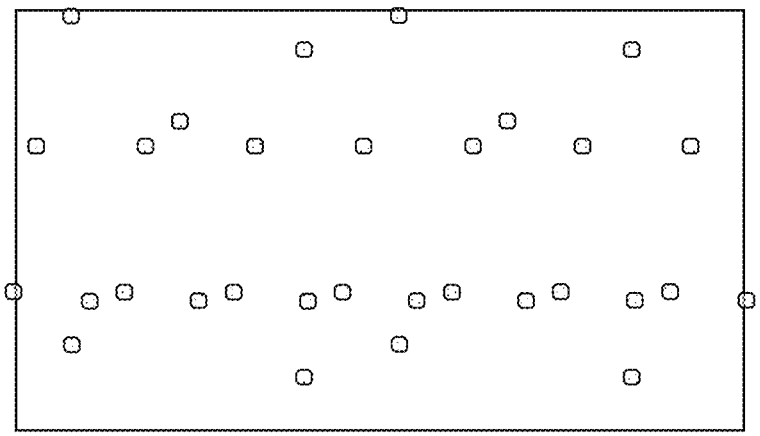
FIG. 9H is a diagram illustrating the structure of a first planarization layer in an array substrate depicted in FIG. 9A.
Figure 9I:
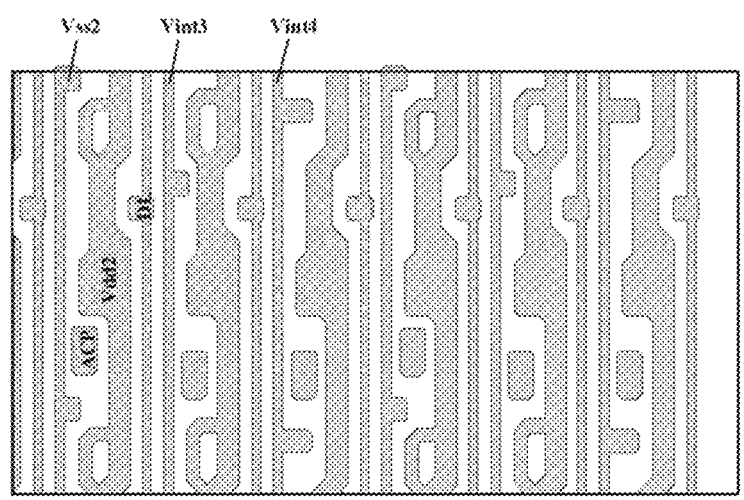
FIG. 9I is a diagram illustrating the structure of a second signal line layer in an array substrate depicted in FIG. 9A.
Figure 9J:
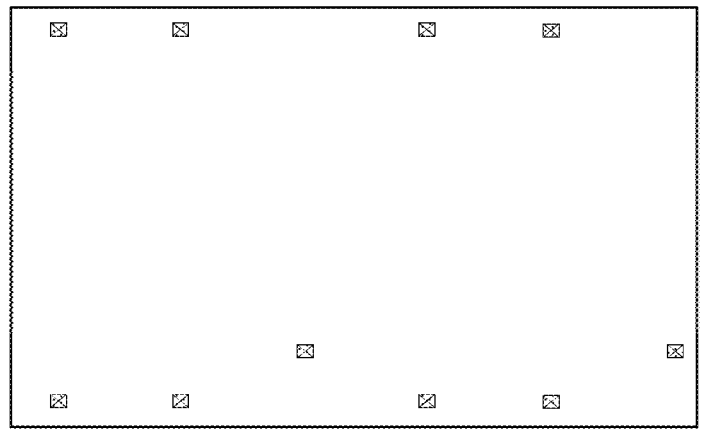
FIG. 9J is a diagram illustrating the structure of a second planarization layer in an array substrate depicted in FIG. 9A.
Figure 9K:
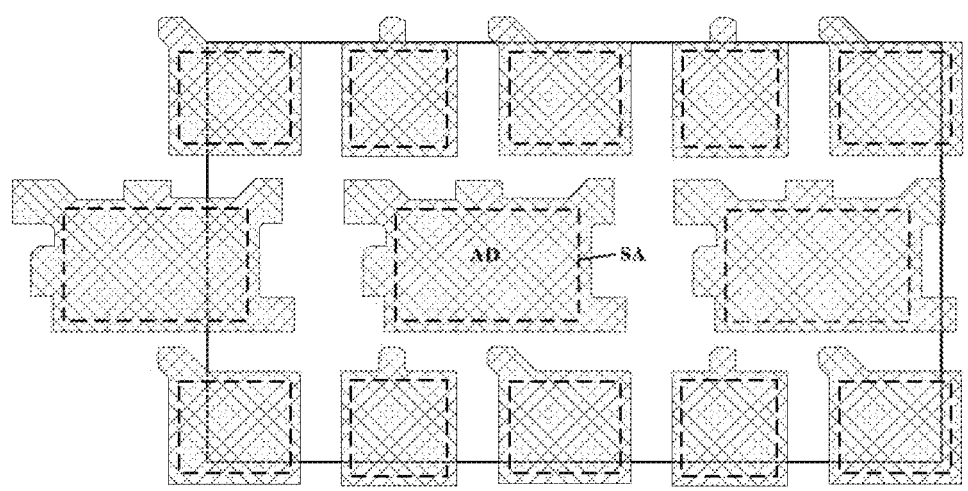
FIG. 9K is a diagram illustrating the structure of an anode layer in an array substrate depicted in FIG. 9A.
Figure 9L:
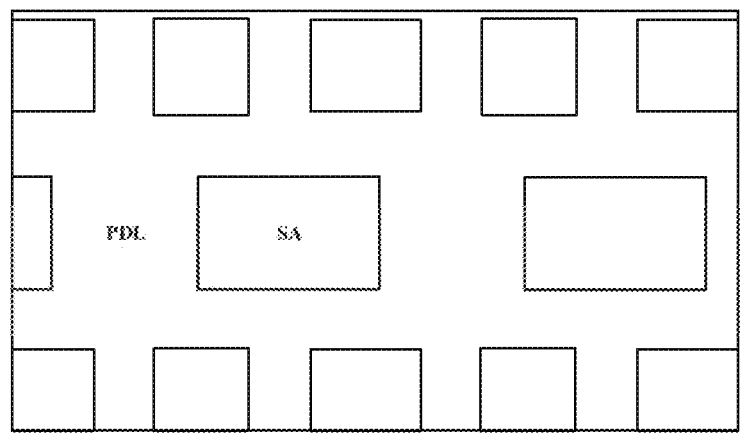
FIG. 9L is a diagram illustrating the structure of a pixel definition layer in an array substrate depicted in FIG. 9A.

FIG. 9A is a diagram illustrating the structure of an array substrate in some embodiments according to the present disclosure. FIG. 9B is a schematic diagram illustrating an arrangement of a plurality of pixel driving circuits in an array substrate depicted in FIG. 9A. FIG. 9C is a diagram illustrating the structure of a semiconductor material layer in an array substrate depicted in FIG. 9A. FIG. 9D is a diagram illustrating the structure of a first conductive layer in an array substrate depicted in FIG. 9A. FIG. 9E is a diagram illustrating the structure of a second conductive layer in an array substrate depicted in FIG. 9A. FIG. 9F is a diagram illustrating the structure of an inter-layer dielectric layer in an array substrate depicted in FIG. 9A. FIG. 9G is a diagram illustrating the structure of a first signal line layer in an array substrate depicted in FIG. 9A. FIG. 9H is a diagram illustrating the structure of a first planarization layer in an array substrate depicted in FIG. 9A. FIG. 9I is a diagram illustrating the structure of a second signal line layer in an array substrate depicted in FIG. 9A. FIG. 9J is a diagram illustrating the structure of a second planarization layer in an array substrate depicted in FIG. 9A. FIG. 9K is a diagram illustrating the structure of an anode layer in an array substrate depicted in FIG. 9A. FIG. 9L is a diagram illustrating the structure of a pixel definition layer in an array substrate depicted in FIG. 9A.

The structures of the semiconductor material layer, the first conductive layer, the second conductive layer, and the anode layer as shown in FIG. 9C, FIG. 9D, FIG. 9E, and FIG. 9K are substantially similar to the corresponding structures depicted in FIG. 3C, FIG. 3D, FIG. 3E, and FIG. 3K.

Referring to FIG. 2A, FIG. 2B, FIG. 9A, and FIG. 9G, the first signal line layer in some embodiments includes further includes a plurality of third voltage supply lines Vss1, as compared to the structure depicted in FIG. 3G. Optionally, the plurality of third voltage supply lines Vss1 extend along a direction substantially parallel to a first direction DR1. In some embodiments, the plurality of first voltage supply lines Vdd1 and the plurality of second voltage supply lines Vdd2 are configured to provide a first reference voltage signal (e.g., a high reference voltage signal), and the plurality of third voltage supply lines Vss1 are configured to provide a second reference voltage signal (e.g., a low reference voltage signal).

As shown in FIG. 9G, the first signal line layer in some embodiments includes a plurality of first reset signal lines Vint1 and a plurality of second reset signal lines Vint2. Optionally, the plurality of first reset signal lines Vint1 and the plurality of second reset signal lines Vint2 extend along a direction substantially parallel to a first direction DR1.

In some embodiments, an orthographic projection of a respective third voltage supply line of the plurality of third voltage supply lines Vss1 on a base substrate is between an orthographic projection of a respective light emitting control signal line of the plurality of light emitting control signal lines em on the base substrate and an orthographic projection of a respective second reset signal line of the plurality of second reset signal lines Vint2 on the base substrate. The inventors of the present disclosure discover that this unique layout can minimize the interference from the second reference voltage signals in the plurality of third voltage supply lines Vss1 to nearby nodes.

Referring to FIG. 2A, FIG. 2B, FIG. 9A, and FIG. 9I, the second signal line layer in some embodiments further includes a plurality of fourth voltage supply lines Vss2, a plurality of third reset signal lines Vint3, and a plurality of fourth reset signal lines Vint4, as compared to the structure depicted in FIG. 3I. Optionally, the plurality of fourth voltage supply lines Vss2, the plurality of third reset signal lines Vint3, and the plurality of fourth reset signal lines Vint4 extend along a direction substantially parallel to a second direction DR2. In some embodiments, the plurality of first voltage supply lines Vdd1 and the plurality of second voltage supply lines Vdd2 are configured to provide a first reference voltage signal (e.g., a high reference voltage signal); and the plurality of third voltage supply lines Vss1 and the plurality of fourth voltage supply lines Vss2 are configured to provide a second reference voltage signal (e.g., a low reference voltage signal).

Figure 10:
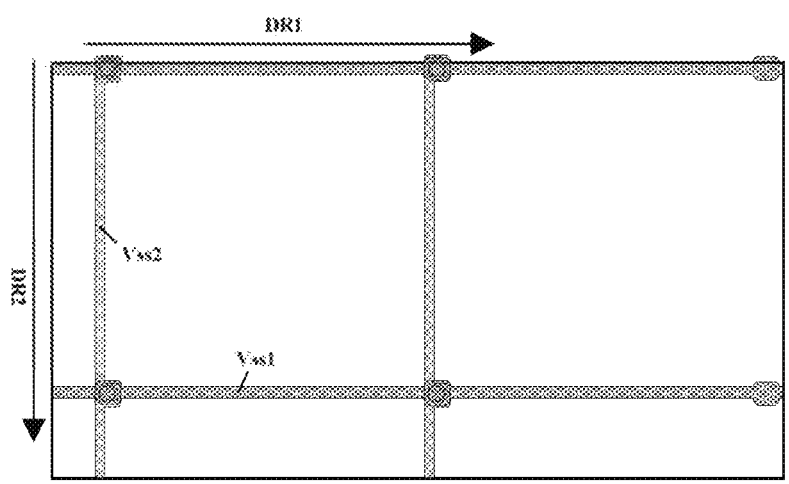
FIG. 10 is a diagram illustrating a voltage supply network in an array substrate in some embodiments according to the present disclosure.

FIG. 10 is a diagram illustrating a voltage supply network in an array substrate in some embodiments according to the present disclosure. Referring to FIG. 10, the voltage supply network in some embodiments includes a plurality of third voltage supply lines Vss1 and a plurality of fourth voltage supply lines Vss2 interconnected to each other. Optionally, the plurality of third voltage supply lines Vss1 extend along a direction substantially parallel to a first direction DR1. Optionally, the plurality of fourth voltage supply lines Vss2 extend along a direction substantially parallel to a second direction DR2. Optionally, the plurality of third voltage supply lines Vss1 are in the first signal line layer. Optionally, the plurality of fourth voltage supply lines Vss2 are in the second signal line layer. Optionally, a respective third voltage supply line of the plurality of third voltage supply lines Vss1 is connected to one or more fourth voltage supply lines of the plurality of fourth voltage supply lines Vss2. Optionally, a respective fourth voltage supply line of the plurality of fourth voltage supply lines Vss2 is connected to one or more third voltage supply lines of the plurality of third voltage supply lines Vss1.

Figure 11:
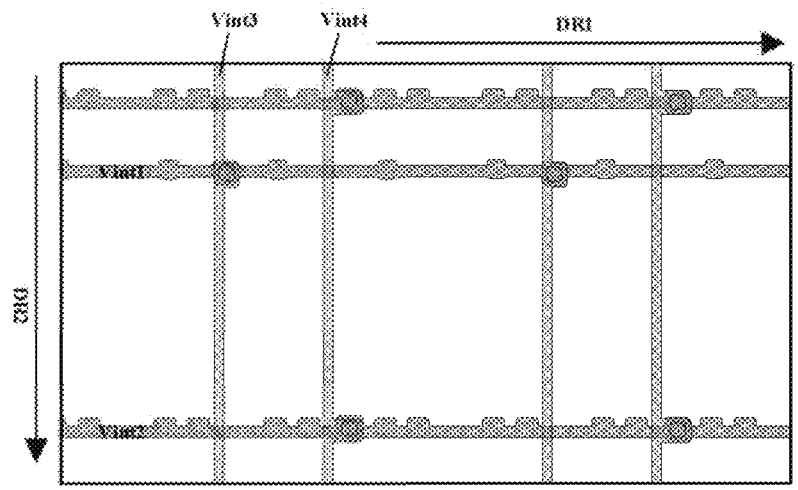
FIG. 11 is a diagram illustrating a first reset signal network and a second reset signal network in an array substrate in some embodiments according to the present disclosure.

FIG. 11 is a diagram illustrating a first reset signal network and a second reset signal network in an array substrate in some embodiments according to the present disclosure. Referring to FIG. 11, the first reset signal network in some embodiments includes a plurality of first reset signal lines Vint1 and a plurality of third reset signal lines Vint3 interconnected to each other. Optionally, the plurality of first reset signal lines Vint1 extend along a direction substantially parallel to a first direction DR1. Optionally, the plurality of third reset signal lines Vint3 extend along a direction substantially parallel to a second direction DR2. Optionally, the plurality of first reset signal lines Vint1 are in the first signal line layer. Optionally, the plurality of third reset signal lines Vint3 are in the second signal line layer. Optionally, a respective first reset signal line of the plurality of first reset signal lines Vint1 is connected to one or more third reset signal lines of the plurality of third reset signal lines Vint3. Optionally, a respective third reset signal line of the plurality of third reset signal lines Vint3 is connected to one or more first reset signal lines of the plurality of first reset signal lines Vint1.

Referring to FIG. 11, the second reset signal network in some embodiments includes a plurality of second reset signal lines Vint2 and a plurality of fourth reset signal lines Vint4 interconnected to each other. Optionally, the plurality of second reset signal lines Vint2 extend along a direction substantially parallel to a first direction DR1. Optionally, the plurality of fourth reset signal lines Vint4 extend along a direction substantially parallel to a second direction DR2. Optionally, the plurality of second reset signal lines Vint2 are in the first signal line layer. Optionally, the plurality of fourth reset signal lines Vint4 are in the second signal line layer. Optionally, a respective second reset signal line of the plurality of second reset signal lines Vint2 is connected to one or more fourth reset signal lines of the plurality of fourth reset signal lines Vint4. Optionally, a respective fourth reset signal line of the plurality of fourth reset signal lines Vint4 is connected to one or more second reset signal lines of the plurality of second reset signal lines Vint2.

Referring to FIG. 9I, FIG. 10, and FIG. 11, in some embodiments, the plurality of fourth voltage supply lines Vss2, the plurality of third reset signal lines Vint3, and the plurality of fourth reset signal lines Vint4 are alternately arranged along a first direction DR1. In one example, a respective fourth voltage supply line of the plurality of fourth voltage supply lines Vss2, a respective reset signal line of the plurality of third reset signal lines Vint3, and a respective fourth reset signal line of the plurality of fourth reset signal lines Vint4 are sequentially arranged along the first direction DR1. In another example, a respective reset signal line of the plurality of third reset signal lines Vint3, a respective fourth voltage supply line of the plurality of fourth voltage supply lines Vss2, and a respective fourth reset signal line of the plurality of fourth reset signal lines Vint4 are sequentially arranged along the first direction DR1.

In some embodiments, a respective fourth voltage supply line of the plurality of fourth voltage supply lines Vss2 is between two adjacent data lines of the plurality of data lines DL configured to provide data signals to two adjacent columns of pixel driving circuits, and is between two adjacent second voltage supply lines of the plurality of second voltage supply lines Vdd2 configured to provide first reference voltage signals to two adjacent columns of pixel driving circuits. In some embodiments, a respective third reset signal line of the plurality of third reset signal lines Vint3 is between two adjacent data lines of the plurality of data lines DL configured to provide data signals to two adjacent columns of pixel driving circuits, and is between two adjacent second voltage supply lines of the plurality of second voltage supply lines Vdd2 configured to provide first reference voltage signals to two adjacent columns of pixel driving circuits. In some embodiments, a respective fourth reset signal line of the plurality of fourth reset signal lines Vint4 is between two adjacent data lines of the plurality of data lines DL configured to provide data signals to two adjacent columns of pixel driving circuits, and is between two adjacent second voltage supply lines of the plurality of second voltage supply lines Vdd2 configured to provide first reference voltage signals to two adjacent columns of pixel driving circuits.

Figure 12:
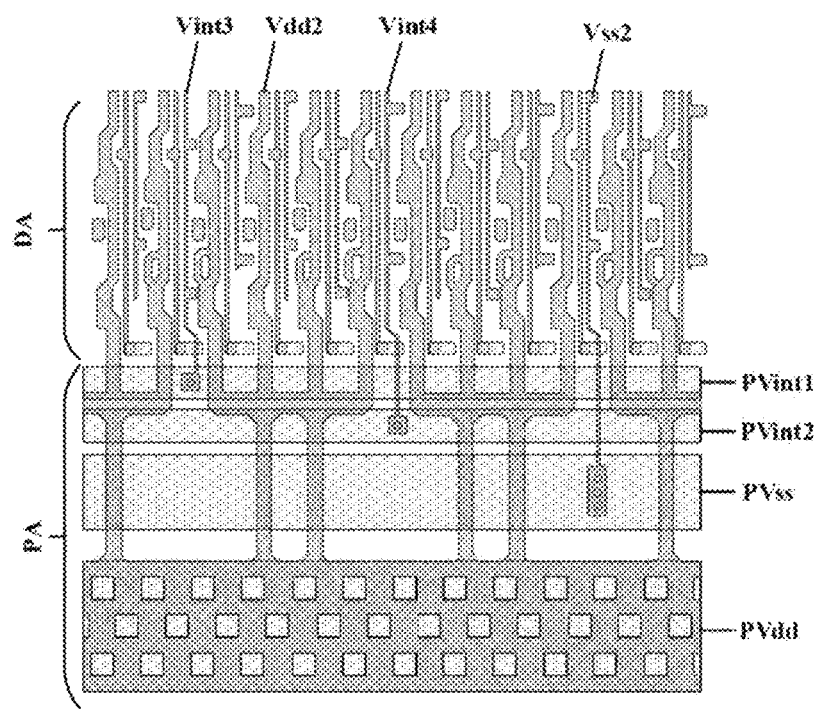
FIG. 12 is a diagram illustrating connection of signal lines in a display area and signal lines in a peripheral area of an array substrate in some embodiments according to the present disclosure.

FIG. 12 is a diagram illustrating connection of signal lines in a display area and signal lines in a peripheral area of an array substrate in some embodiments according to the present disclosure. Referring to FIG. 12, the array substrate in some embodiments includes a display area DA and a peripheral area PA. As used herein, the term "display area" refers to an area of an array substrate in a display panel where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display panel. An inter-subpixel region refers to a region between adjacent subpixel regions, such as a region corresponding to a black matrix in a liquid crystal display or a region corresponding a pixel definition layer in an organic light emitting diode display panel. Optionally, the inter-subpixel region is a region between adjacent subpixel regions in a same pixel. Optionally, the inter-subpixel region is a region between two adjacent subpixel regions from two adjacent pixels. As used herein the term "peripheral area" refers to an area of an array substrate in a display panel where various circuits and wires are provided to transmit signals to the display substrate. To increase the transparency of the display apparatus, non-transparent or opaque components of the display apparatus (e.g., battery, printed circuit board, metal frame), can be disposed in the peripheral area rather than in the display area.

In some embodiments, the array substrate includes a first peripheral voltage supply line PVdd in the peripheral area PA. The plurality of second voltage supply lines Vdd2 in the display area DA are connected to the first peripheral voltage supply line PVdd in the peripheral area PA, respectively. Optionally, the first peripheral voltage supply line PVdd includes a first sub-layer in the first signal line layer and a second sub-layer in the second signal line layer.

In some embodiments, the array substrate includes a second peripheral voltage supply line PVss in the peripheral area PA. The plurality of fourth voltage supply lines Vss2 in the display area DA are connected to the second peripheral voltage supply line PVss in the peripheral area PA, respectively. Optionally, the second peripheral voltage supply line PVss is in the first signal line layer.

In some embodiments, the array substrate includes a first peripheral reset signal line PVint1 in the peripheral area PA. The plurality of third reset signal lines Vint3 in the display area DA are connected to the first peripheral reset signal line PVint1 in the peripheral area PA, respectively. Optionally, the first peripheral reset signal line PVint1 is in the first signal line layer.

In some embodiments, the array substrate includes a second peripheral reset signal line PVint2 in the peripheral area PA. The plurality of fourth reset signal lines Vint4 in the display area DA are connected to the second peripheral reset signal line PVint2 in the peripheral area PA, respectively. Optionally, the second peripheral reset signal line PVint2 is in the first signal line layer.

Figure 13:
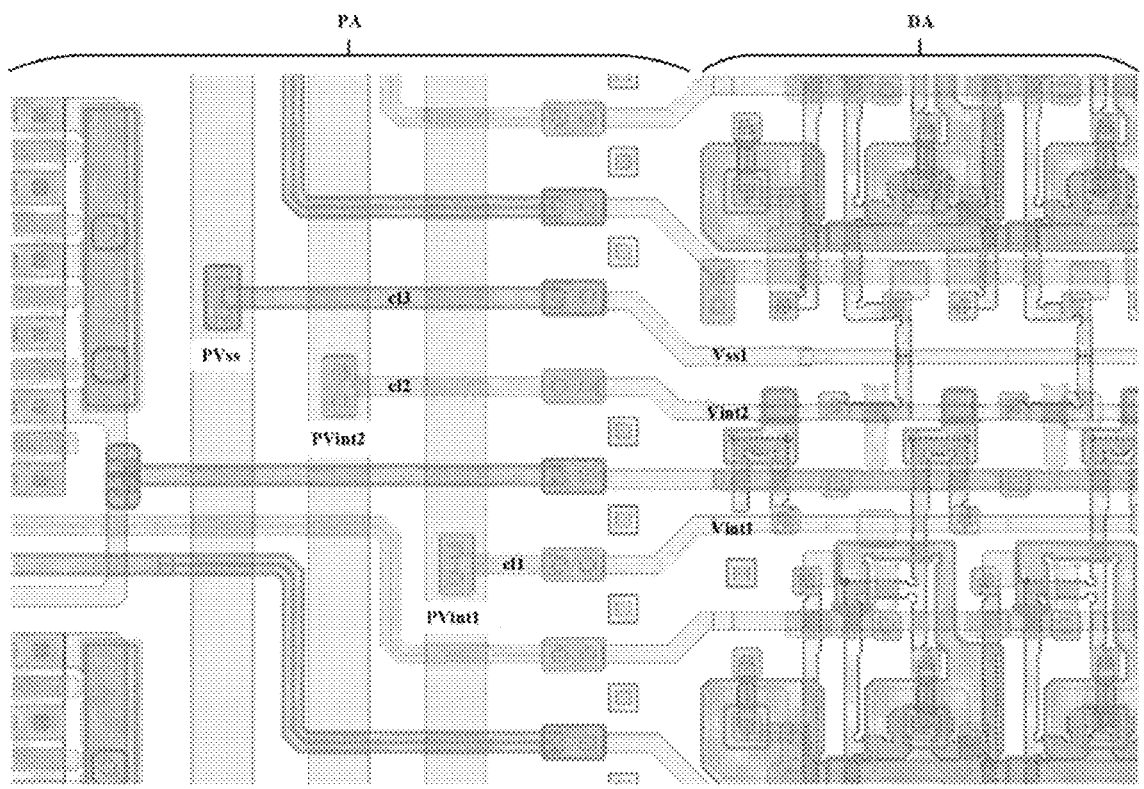
FIG. 13 is a diagram illustrating connection of signal lines in a display area and signal lines in a peripheral area of an array substrate in some embodiments according to the present disclosure.

FIG. 13 is a diagram illustrating connection of signal lines in a display area and signal lines in a peripheral area of an array substrate in some embodiments according to the present disclosure. Referring to FIG. 13, the plurality of first reset signal lines Vint1 in the display area DA are connected to the first peripheral reset signal line PVint1 in the peripheral area PA, respectively. Optionally, a respective first reset signal line of the plurality of first reset signal lines Vint1 is connected to the first peripheral reset signal line PVint1 through a first connecting line cl1. In one example, the first connecting line cl1 is in the first conductive layer, the first peripheral reset signal line PVint1 is in the first signal line layer, and the plurality of first reset signal lines Vint1 are in the first signal line layer.

In some embodiments, the plurality second reset signal lines Vint2 in the display area DA are connected to the second peripheral reset signal line PVint2 in the peripheral area PA, respectively. Optionally, a respective second reset signal line of the plurality of second reset signal lines Vint2 is connected to the second peripheral reset signal line PVint2 through a second connecting line cl2. In one example, the second connecting line cl2 is in the second conductive layer, the second peripheral reset signal line PVint2 is in the first signal line layer, and the plurality of second reset signal lines Vint2 are in the first signal line layer.

In some embodiments, the plurality of third voltage supply lines Vss1 in the display area DA are connected to the second peripheral voltage supply line PVss in the peripheral area PA, respectively. Optionally, a respective third voltage supply line of the plurality of third voltage supply lines Vss1 is connected to the second peripheral voltage supply line PVss through a third connecting line cl3. In one example, the third connecting line cl3 is in the second conductive layer, the second peripheral voltage supply line PVss is in the first signal line layer, and the plurality of third voltage supply lines Vss1 are in the first signal line layer.

Figure 14:
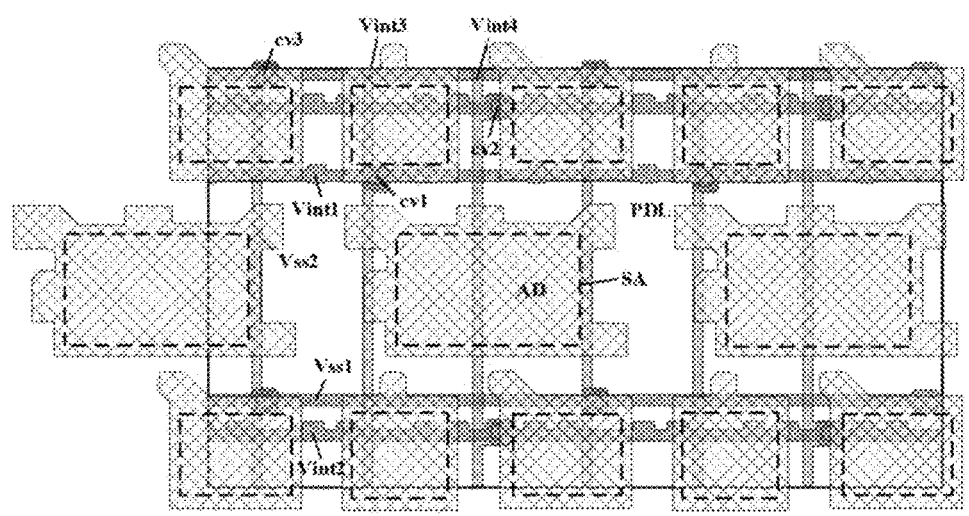
FIG. 14 is a diagram illustrating a voltage supply network, a first reset signal network, a second reset signal network, and an anode layer in an array substrate in some embodiments according to the present disclosure.

FIG. 14 is a diagram illustrating a voltage supply network, a first reset signal network, a second reset signal network, and an anode layer in an array substrate in some embodiments according to the present disclosure. Referring to FIG. 14, in some embodiments, vias connecting signal lines of the voltage supply network, the first reset signal network, and the second reset signal network are substantially outside regions of the plurality of subpixel apertures SA. In some embodiments, an orthographic projection of the pixel definition layer on a base substrate substantially covers (e.g., at least 80% covers, at least 85% covers, at least 90% covers, at least 95% covers, at least 99% covers, or completely covers) an orthographic projection of a conductive material in the vias connecting signal lines of the voltage supply network, the first reset signal network, and the second reset signal network on the base substrate.

In some embodiments, the array substrate includes a plurality of first connecting vias cv1 respectively connecting the plurality of first reset signal lines Vint1 and the plurality of third reset signal lines Vint3. Optionally, the plurality of first connecting vias cv1 are substantially outside regions of the plurality of subpixel apertures SA. Optionally, an orthographic projection of the pixel definition layer on a base substrate substantially covers (e.g., at least 80% covers, at least 85% covers, at least 90°% covers, at least 95% covers, at least 99% covers, or completely covers) an orthographic projection of a conductive material in the plurality of first connecting vias cv1 on the base substrate.

In some embodiments, the array substrate includes a plurality of second connecting vias cv2 respectively connecting the plurality of second reset signal lines Vint2 and the plurality of fourth reset signal lines Vint4. Optionally, the plurality of second connecting vias cv2 are substantially outside regions of the plurality of subpixel apertures SA. Optionally, an orthographic projection of the pixel definition layer on a base substrate substantially covers (e.g., at least 80% covers, at least 85% covers, at least 90% covers, at least 95% covers, at least 99% covers, or completely covers) an orthographic projection of a conductive material in the plurality of second connecting vias cv2 on the base substrate.

In some embodiments, the array substrate includes a plurality of third connecting vias cv3 respectively connecting the plurality of third voltage supply lines Vss1 and the plurality of fourth voltage supply lines Vss2. Optionally, the plurality of third connecting vias cv3 are substantially outside regions of the plurality of subpixel apertures SA. Optionally, an orthographic projection of the pixel definition layer on a base substrate substantially covers (e.g., at least 80% covers, at least 85% covers, at least 90/covers, at least 95% covers, at least 99% covers, or completely covers) an orthographic projection of a conductive material in the plurality of third connecting vias cv3 on the base substrate.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a pixel driving circuit having a first reset transistor and a second reset transistor. Optionally, at least a portion of a gate electrode of a first reset transistor in a present row of pixel driving circuits and at least a portion of a gate electrode of a second reset transistor in a previous row of pixel driving circuits are parts of a unitary structure. Optionally, the gate electrode of the first reset transistor in the present row of pixel driving circuits and the gate electrode of the second reset transistor in the previous row of pixel driving circuits are arranged along a direction non-parallel to an extension direction of reset control signal lines.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a pixel driving circuit having a first reset transistor and a second reset transistor;
    wherein at least a portion of a gate electrode of a first reset transistor in a present row of pixel driving circuits and at least a portion of a gate electrode of a second reset transistor in a previous row of pixel driving circuits are parts of a unitary structure; and
    the gate electrode of the first reset transistor in the present row of pixel driving circuits and the gate electrode of the second reset transistor in the previous row of pixel driving circuits are arranged along a direction non-parallel to an extension direction of reset control signal lines.

2. The array substrate of claim 1, wherein a channel direction of the first reset transistor is non-parallel to a channel direction of the second reset transistor; and
    the channel direction of the first reset transistor and the channel direction of the second reset transistor intersect each other, forming a non-zero included angle.

3. The array substrate of claim 1, further comprising a plurality of first reset signal lines, a plurality of second reset control signal lines, and a plurality of second reset signal lines;
    wherein the plurality of second reset control signal lines comprises a second reset control signal line in a present stage;
    in a same row of pixel driving circuit, an orthographic projection of a respective first reset signal line of the plurality of first reset signal lines on a base substrate is between an orthographic projection of the second reset control signal line in the present stage on the base substrate and an orthographic projection of a respective second reset signal line of the plurality of second reset signal lines on the base substrate.

4. The array substrate of claim 1, wherein the pixel driving circuit further comprises a data write transistor, a compensating transistor, and a driving transistor;
the array substrate comprises a semiconductor material layer;
the semiconductor material layer comprises:
a continuous line comprising an active layer and a second electrode of the compensating transistor, and a second electrode of the first reset transistor; and
a branch branching from the continuous line;
wherein the branch is connected to a gate electrode of the driving transistor; and
an orthographic projection of the branch on a base substrate is non-overlapping with is an orthographic projection of an electrode block comprising a gate electrode of the data write transistor and a gate electrode of the compensating transistor on the base substrate.

5. The array substrate of claim 1, further comprising a plurality of first reset control signal lines;
wherein a respective first reset control signal line of the plurality of first reset control signal lines comprises a main line portion extending along a direction substantially parallel to a first direction, and a protrusion protruding away from the main line portion along a direction substantially parallel to a second direction, the second direction being different from the first direction;
the protrusion comprises the at least the portion of the gate electrode of the second reset transistor in the previous row of pixel driving circuits; and
the main line portion comprises the at least the portion of the gate electrode of the first reset transistor in the present row of pixel driving circuits.

6. The array substrate of claim 1, further comprising a plurality of first reset control signal lines and a plurality of second reset control signal lines;
wherein the gate electrode of the first reset transistor comprises a first portion from a respective first reset control signal line of the plurality of first reset control signal lines and a second portion from a respective second reset control signal line of the plurality of second reset control signal lines; and
an orthographic projection of the first portion on a base substrate at least partially overlaps with an orthographic projection of the second portion on the base substrate.

7. The array substrate of claim 1, further comprising a voltage supply network;
wherein the voltage supply network comprises a plurality of third voltage supply lines and a plurality of fourth voltage supply lines;
a respective third voltage supply line of the plurality of third voltage supply lines is connected to one or more fourth voltage supply lines of the plurality of fourth voltage supply lines; and
a respective fourth voltage supply line of the plurality of fourth voltage supply lines is connected to one or more third voltage supply lines of the plurality of third voltage supply lines;
the plurality of third voltage supply lines are in a first signal line layer; and
the plurality of fourth voltage supply lines are in a second signal line layer on a side of the first signal line layer away from a base substrate.

8. The array substrate of claim 7, further comprising a plurality of light emitting control signal lines and a plurality of second reset signal lines;
wherein an orthographic projection of a respective third voltage supply line of the plurality of third voltage supply lines on a base substrate is between an orthographic projection of a respective light emitting control signal line of the plurality of light emitting control signal lines on the base substrate and an orthographic projection of a respective second reset signal line of the plurality of second reset signal lines on the base substrate.

9. The array substrate of claim 1, further comprising a first reset signal network and a second reset signal network;
wherein the first reset signal network comprises a plurality of first reset signal lines and a plurality of third reset signal lines;
the second reset signal network comprises a plurality of second reset signal lines and a plurality of fourth reset signal lines;
a respective first reset signal line of the plurality of first reset signal lines is connected to one or more third reset signal lines of the plurality of third reset signal lines;
a respective third reset signal line of the plurality of third reset signal lines is connected to one or more first reset signal lines of the plurality of first reset signal lines;
a respective second reset signal line of the plurality of second reset signal lines is connected to one or more fourth reset signal lines of the plurality of fourth reset signal lines; and
a respective fourth reset signal line of the plurality of fourth reset signal lines is connected to one or more second reset signal lines of the plurality of second reset signal lines.

10. The array substrate of claim 1, further comprising a plurality of data lines, a plurality of second voltage supply lines, a plurality of third reset signal lines, a plurality of fourth reset signal lines, and a plurality of fourth voltage supply lines;
wherein a respective fourth voltage supply line of the plurality of fourth voltage supply lines is between two adjacent data lines of the plurality of data lines configured to provide data signals to two adjacent columns of pixel driving circuits, and is between two adjacent second voltage supply lines of the plurality of second voltage supply lines configured to provide first reference voltage signals to two adjacent columns of pixel driving circuits;
a respective third reset signal line of the plurality of third reset signal lines is between two adjacent data lines of the plurality of data lines configured to provide data signals to two adjacent columns of pixel driving circuits, and is between two adjacent second voltage supply lines of the plurality of second voltage supply lines configured to provide first reference voltage signals to two adjacent columns of pixel driving circuits; and
a respective fourth reset signal line of the plurality of fourth reset signal lines is between two adjacent data lines of the plurality of data lines configured to provide data signals to two adjacent columns of pixel driving circuits, and is between two adjacent second voltage supply lines of the plurality of second voltage supply lines configured to provide first reference voltage signals to two adjacent columns of pixel driving circuits.

11. The array substrate of claim 1, wherein the pixel driving circuit further comprises a storage capacitor and a compensating transistor;
wherein the storage capacitor comprises a first capacitor electrode and a second capacitor electrode;

the second capacitor electrode is configured to be provided with a first reference voltage signal;

an orthographic projection of a unitary structure comprising the second capacitor electrode on a base substrate at least partially overlaps with an orthographic projection of a portion of a semiconductor material layer between two channel parts of the compensating transistor on the base substrate.

12. The array substrate of claim 11, wherein the unitary structure comprising the second capacitor electrode comprises a main body and an extension extending away from the main body;

the extension E includes a first portion, a second portion, and a third portion;

the first portion connects the main body with the second portion;

the second portion connects the first portion with the third portion;

the first portion and the third portion extend along a direction substantially parallel to the second direction, respectively; and the second portion extends along a direction substantially parallel to the first direction.

13. The array substrate of claim 12, wherein an orthographic projection of the third portion on the base substrate at least partially overlaps with an orthographic projection of the portion of the semiconductor material layer between the two channel parts of the compensating transistor on the base substrate.

14. The array substrate of claim 12, further comprising a node connecting line and a plurality of data lines;

wherein the extension spaces apart the node connecting line from the respective data line of the plurality of data lines configured to provide data signal to the pixel driving circuit.

15. The array substrate of claim 11, further comprising a node connecting line and a plurality of gate lines;

wherein the node connecting line is connected to a second electrode of the compensating transistor at a position between a respective gate line of the plurality of gate lines and capacitor electrodes of the storage capacitor;

an orthographic projection of the node connecting line on a base substrate is non-overlapping with an orthographic projection of the plurality of gate lines on the base substrate; and an orthographic projection of the second electrode of the compensating transistor on the base substrate partially overlaps with the orthographic projection of the respective gate line on the base substrate.

16. The array substrate of claim 11, further comprising a node connecting line and a plurality of data lines;

wherein the second capacitor electrode spaces apart the node connecting line from the respective data line of the plurality of data lines configured to provide data signal to the pixel driving circuit.

17. The array substrate of claim 1, further comprising a shielding block and a plurality of first reset signal lines;

wherein the pixel driving circuit further comprises a compensating transistor;

the shielding block is connected to a respective first reset signal line of the plurality of first reset signal lines; and an orthographic projection of the shielding block on a base substrate at least partially overlaps with an orthographic projection of a portion of the semiconductor material layer between two channel parts of the compensating transistor on the base substrate.

18. The array substrate of claim 1, wherein the pixel driving circuit further comprises a compensating transistor and a data write transistor;

wherein at least a portion of a gate electrode of a compensating transistor in a present column of pixel driving circuits and at least a portion of a gate electrode of a data write transistor in a previous column of pixel driving circuits are parts of a unitary structure.

19. The array substrate of claim 18, further comprising a plurality of gate lines;

wherein the unitary structure comprising the at least the portion of the gate electrode of the compensating transistor in the present column of pixel driving circuits and the at least the portion of the gate electrode of the data write transistor in the previous column of pixel driving circuits is connected to a gate line of the plurality of gate lines.

20. A display apparatus, comprising the array substrate of claim 1, and one or more integrated circuits connected to the array substrate.

* * * * *